United States Patent
Lee et al.

(10) Patent No.: US 9,837,165 B2
(45) Date of Patent: Dec. 5, 2017

(54) DATA STORAGE DEVICE AND METHOD OF DRIVING THE SAME

(71) Applicants: SK hynix Inc., Icheon (KR); Seoul National University R&DB foundation, Seoul (KR)

(72) Inventors: Jong Ho Lee, Seoul (KR); Nag Yong Choi, Jeonju (KR)

(73) Assignees: SK HYNIX INC., Icheon (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 15/394,584

(22) Filed: Dec. 29, 2016

(65) Prior Publication Data

US 2017/0194057 A1    Jul. 6, 2017

(30) Foreign Application Priority Data

Dec. 31, 2015 (KR) .................. 10-2015-0191883

(51) Int. Cl.
*G11C 16/04*    (2006.01)
*G11C 16/34*    (2006.01)
(Continued)

(52) U.S. Cl.
CPC ...... *G11C 16/3431* (2013.01); *G11C 16/0483* (2013.01); *G11C 16/10* (2013.01);
(Continued)

(58) Field of Classification Search
CPC ................................................ G11C 16/0483
(Continued)

(56) References Cited

U.S. PATENT DOCUMENTS 8,363,476 B2 * 1/2013 Lue .................... G11C 16/0466
                                                              365/185.05
8,503,213 B2 * 8/2013 Chen ................. H01L 27/11573
                                                              365/148

(Continued)

FOREIGN PATENT DOCUMENTS

KR         10-1538071 B1    7/2015

*Primary Examiner* — Hoai V Ho
*Assistant Examiner* — Jay Radke

(57) ABSTRACT

A data storage device includes a semiconductor structure including a first conductive-type region having a first-type conductivity, a second conductive-type region spaced apart from the first conductive-type region and having a second-type conductivity opposite to the first-type conductivity, and a semiconductor region between the first conductive-type region and the second conductive-type region and including a neighboring portion adjacent to the second conductive-type region; a mode select transistor including a gate electrode aligned with the neighboring portion and an insulation layer between the gate electrode and the neighboring portion; a plurality of memory cell transistors including a plurality of control gate electrodes aligned with the semiconductor region, and a data storage layer interposed between the plurality of control gate electrodes and the semiconductor region; a first wire electrically connected to the first conductive-type region; and a second wire including an ambipolar contact having a first contact between the second wire and the second conductive-type region, and a second contact between the second wire and the neighboring portion.

20 Claims, 13 Drawing Sheets

(51) Int. Cl.
    *H01L 27/11556*     (2017.01)
    *H01L 27/11582*     (2017.01)
    *H01L 29/47*     (2006.01)
    *G11C 16/24*     (2006.01)
    *G11C 16/10*     (2006.01)
    *G11C 16/16*     (2006.01)
    *G11C 16/26*     (2006.01)

(52) U.S. Cl.
    CPC .............. *G11C 16/16* (2013.01); *G11C 16/24* (2013.01); *G11C 16/26* (2013.01); *G11C 16/3413* (2013.01); *H01L 27/11556* (2013.01); *H01L 27/11582* (2013.01); *H01L 29/47* (2013.01)

(58) Field of Classification Search
    USPC .................................................... 365/185.17
    See application file for complete search history.

(56) References Cited

U.S. PATENT DOCUMENTS

| | | | |
|---|---|---|---|
| 2014/0112074 A1* | 4/2014 | Rhie | G11C 16/06 365/185.11 |
| 2014/0362644 A1* | 12/2014 | Lue | H01L 27/092 365/185.17 |
| 2015/0131381 A1 | 5/2015 | Rhie | |
| 2016/0049201 A1* | 2/2016 | Lue | G11C 16/0483 365/185.11 |

\* cited by examiner

DATA STORAGE DEVICE AND METHOD OF DRIVING THE SAME

CROSS-REFERENCE TO RELATED APPLICATION

The present application claims priority under 35 U.S.C. §119(a) to Korean Patent Application 10-2015-0191883, filed on Dec. 31, 2015, which is herein incorporated by reference in its entirety.

BACKGROUND

1. Field

Embodiments of the present disclosure relate to a semiconductor memory technique, and more particularly, to a data storage device and a method of driving the same.

2. Description of the Related Art

Due to increasing demands for portable application devices, such as digital cameras, smart phones, and tablet PCs, and replacement of conventional hard disk drives with solid-state drives (SSDs), markets for non-volatile memory devices are rapidly growing. Among these non-volatile memory devices, NAND flash memory devices are popular due to low manufacturing cost for high degree of integration.

Recently, downscaling the NAND flash memory device with conventional two-dimensional (2D) memory cell array architecture has become more difficult as 20 nm or smaller photolithography techniques have reached their limits. In addition, design issues, which are related to reduction of a sensing margin in accordance with reduction of a number of electrons stored in a data storage film (e.g., a floating gate), and related to disturbances between memory cells, have become barriers against the downscaling of the conventional 2D memory cell array architecture. To address the issues for downscaling the NAND flash memory device, various 3D NAND flash array structures have been suggested.

In the 3D NAND flash array structures, as an I-V curve of memory cells does not have a precipitous slope within a range of operating voltages of the memory cells, threshold voltages $V_{th}$ of the memory cells exhibit a wide distribution, resulting in a narrow and tight refresh margin for operating a 3D NAND flash memory device. Such a narrow and tight refresh margin may increase a read time of an addressed memory cell of the 3D NAND flash memory device, thereby impeding improvement of an operating speed of the 3D NAND flash memory device. Therefore, in order to enhance an operating speed for a NAND flash memory device, a new mechanism for operating a flash memory device and a suitable memory cell structure for implementing the mechanism are required.

SUMMARY

Embodiments of the present disclosure provide a data storage device based on a non-volatile memory device with enhancing I-V characteristics by improving architecture of a memory array without complicate modification or addition of a peripheral circuit.

In addition, embodiments of the present disclosure provide a data storage device that may implement two-type selective operating mechanisms with improved operating characteristics based on a single architecture of a non-volatile memory device.

Embodiments of the present disclosure also provide a method of driving a data storage device having the above-stated advantages.

According to an aspect of the present disclosure, there is provided a data storage device including a semiconductor structure including a first conductive-type region having a first-type conductivity, a second conductive-type region that is spaced apart from the first conductive-type region and has a second-type conductivity opposite to the first-type conductivity of the first conductive-type region, and a semiconductor region that is disposed between the first conductive-type region and the second conductive-type region, the semiconductor region including a neighbouring portion that is adjacent to the second conductive-type region; a mode select transistor including a gate electrode and an insulation layer, the gate electrode being aligned with the neighbouring portion of the semiconductor region, the insulation layer being disposed between the gate electrode and the neighbouring portion of the semiconductor region; a plurality of memory cell transistors including a plurality of control gate electrodes and a data storage layer, the plurality of control gate electrodes being aligned with the semiconductor region, the data storage layer being interposed between the plurality of control gate electrodes and the semiconductor region; a first wire electrically connected to the first conductive-type region; and a second wire including an ambipolar contact having a first contact between the second wire and the second conductive-type region and a second contact between the second wire and the neighbouring portion.

The first contact may be an ohmic contact and the second contact may be a Schottky contact. According to an embodiment, the first and second conductive-type regions may include high-concentration impurity regions, and the semiconductor region may be an intrinsic semiconductor region or a low-concentration impurity region having the first-type conductivity.

According to an embodiment, the insulation layer may be stacked with the data storage layer between the neighbouring portion and the gate electrode of the mode select transistor. The data storage device may undergo a pre-programming operation and a pre-erasing operation. The pre-programming operation and the pre-erasing operation may be performed based on a mode selected by the mode select transistor, the selected mode setting a type of driving charges of the semiconductor structure.

The second conductive-type region and the semiconductor region may be integrated into a semiconductor layer or a semiconductor body. The semiconductor region of the semiconductor structure may have a 3D structure that vertically extends from a main surface of a substrate, and the semiconductor region may include a vertical channel. In an example, the first conductive-type region of the semiconductor structure may comprise a first conductive-type impurity region disposed on the substrate, and the semiconductor region may contact the first conductive-type impurity region.

The semiconductor structure may include the second conductive-type region and the semiconductor region, the semiconductor structure having a hollow cylindrical structure. An interior space of the semiconductor structure may be filled with an insulator. A surface of the insulator is partially recessed from an end of the semiconductor structure toward the substrate, and a surface of the second conductive-type region and a surface of the neighbouring portion may be exposed inside of the hollow cylindrical structure. The first contact may be provided between the second wire and the exposed surface of the second conductive-type region, and the second contact may be provided between the second wire and the exposed surface of the neighbouring portion. A bottom portion of the hollow cylindrical structure may extend onto a surface of the substrate.

In an example, wherein each of the second conductive-type region and the semiconductor region may have a solid pillar structure, and the second wire may contact the exposed surfaces of the second conductive-type region and the neighbouring portion. The ambipolar contact may include the contact between the second wire and the exposed surfaces. In other example, each of the second conductive-type region and the semiconductor region may have a solid pillar structure, and the second wire fills a penetrating hole of the solid pillar structure, the penetrating hole having a depth from an end of the second conductive-type region to the neighbouring portion. The ambipolar contact may be formed at a surface of the penetrating hole.

According to an embodiment, the semiconductor region of the semiconductor structure may be horizontally stacked on a main surface of a substrate, and the semiconductor region may include a horizontal channel. The data storage layer and the control gate electrode may have a stacked memory array transistor (SMArT) structure, a terabit cell array transistor (TCAT) structure, a bitcost scalable (BiCS) structure, a P-BiCS structure, a vertical-recess-array-transistor (VRAT) structure, a vertical gate structure, or a channel stacked structure.

According to an embodiment, the first wire may be a common source line, and the second wire may be a bitline. Charges may be accumulated in the neighbouring portion when a pre-programming operation or a pre-erasing operation is performed, the mode select transistor selecting a mode of the data storage device corresponding to a type of the charges of the data storage device. Furthermore, when a negative voltage is applied to the gate electrode of the mode select transistor, the data storage device may be driven by a hole current flowing in the semiconductor region, and when a positive voltage is applied to the gate electrode of the mode select transistor, the data storage device may be driven by an electron current flowing in the semiconductor region.

When the semiconductor structure is driven by the hole current, the data storage device may be operated based on a positive feedback diode-type operating mechanism, and when the semiconductor structure is driven by the electron current, the data storage device may be operated based on a field-effect transistor-type operating mechanism.

According to another aspect of the present disclosure, there is provided a method of driving a data storage device according to an embodiment, the method comprising a read process based on any of a positive feedback diode-type operating mechanism and a field-effect transistor-type operating mechanism, according to a polarity of a voltage applied to the gate electrode of the mode select transistor.

According to an embodiment, the first impurity may be an n-type impurity and the second impurity may be a p-type impurity. The data storage device may be operated based on the positive feedback diode-type operating mechanism when a negative operation voltage is applied to the gate electrode of the mode select transistor. The data storage device may be operated based on the field-effect transistor-type operating mechanism when a positive operation voltage is applied to the gate electrode of the mode select transistor.

Furthermore, the method may further include performing a pre-programming operation or a pre-erasing operation based on a mode selected by the mode select transistor according to the operating mechanism of the read process. According to another embodiment, the method may further include performing a pre-charging step before a reading step on a selected one of the plurality of memory cell transistors, the pre-charging step preventing unnecessary programming.

According to an embodiment, the pre-charging step may include applying a negative turn-on voltage to a mode select line connected to the mode select transistor; applying a positive pass voltage to lower memory cell transistors and to upper nearby memory cell transistors of the selected memory cell transistor; and applying a negative pass voltage to upper-upper memory cell transistors of the selected memory cell transistor. The read process may comprise applying a turn-off voltage to a ground select line and applying a voltage smaller than a verify voltage to a wordline of the selected memory cell transistor, applying an operation voltage to a common source line and to an unselected bitline; applying a read voltage to the wordline of the selected memory cell transistor; and applying a turn-on voltage to the ground select line.

According to another embodiment, the pre-charging step may include applying a positive turn-on voltage to the mode select line of the mode select transistor and to the ground select line; and applying a positive pass voltage to wordlines of unselected memory cell transistors. In this case, the read process may include applying an operation voltage to a selected bitline and grounding an unselected bitline; and applying a read voltage to a wordline of the selected memory cell transistor and applying a pass voltage to the wordlines of the unselected memory cell transistors.

If required, a pre-programming operation or a pre-erasing operation on the mode select transistor may be further performed, according to the operating mechanisms of the read process.

According to an embodiment of the present disclosure, as a first conductive-type region electrically connected to a first wire and a second conductive-type region, which is apart from the first conductive-type region, is electrically connected to a second wire, and is also electrically connected to a neighbouring portion adjacent to the second conductive-type region, provide an ambipolar contact and provide a mode select transistor on the neighbouring portion, a memory string having a single structure may be driven according to a diode-type operating mechanism and a field-effect transistor-type operating mechanism by controlling the ambipolar contact based on voltage and state of a gate electrode of the mode select transistor, and thus a data storage device having expanded applicability may be provided. Furthermore, the diode-type operating mechanism may improve I-V characteristic, thereby providing a data storage device with improved operating speed.

Furthermore, according to an embodiment of the present disclosure, a method of driving a data storage device, in which a read step regarding the data storage device may be performed according to a diode-type operating mechanism or a field-effect transistor-type operating mechanism based on sizes and polarities of voltages applied to the gate electrode of the mode select transistor. Furthermore, according to an embodiment of the present disclosure, a method of driving a data storage device, in which a pre-charging step is performed before the read step in order to prevent memory cells from being unnecessarily programmed or degraded during the read step and improve durability of the data storage device.

BRIEF DESCRIPTION OF THE DRAWINGS

Hereinafter, embodiments of the present disclosure will be described in greater detail with reference to the accompanying drawings.

DETAILED DESCRIPTION OF THE INVENTION

Figure 1:
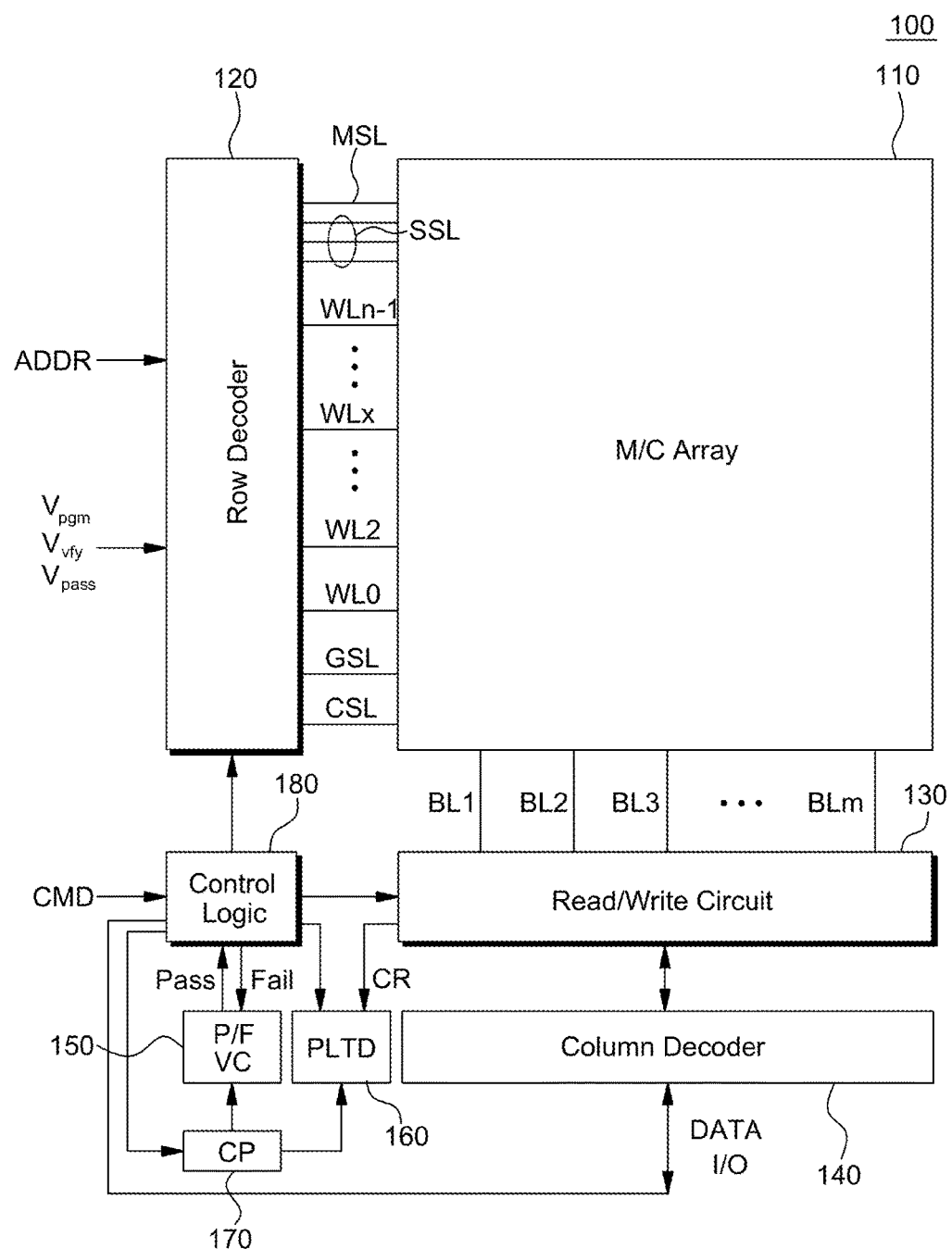
FIG. 1 is a block diagram showing a non-volatile memory device in accordance with an embodiment of the present disclosure.

The present disclosure will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Furthermore, a structure or a form shape "adjacent to" other shape may overlap the adjacent shape or be arranged below the adjacent shape.

The relative terms including "below," "above," "upper." "lower," "horizontal," and "vertical" may be used to describe a relationship between an element, a layer, or a region and another element, another layer, or another region as shown in the drawings. It should be understood that the terms are not limited to the orientations shown in the drawings.

FIG. 1 is a block diagram showing a non-volatile memory device 100 in accordance with an embodiment of the present disclosure.

Referring to FIG. 1, the non-volatile memory device 100 may include a memory cell array 110 having a plurality of memory cells, a row decoder 120, a read/write circuit 130, and a column decoder 140. The memory cell array 110 may be connected to the row decoder 120 via wordlines WL0 to WLn−1, mode selection line MSL, string selection lines SSL, and a common source line CSL, n being a positive integer. Furthermore, the memory cell array 110 may be connected to the read/write circuit 130 via bitlines BL1 to BLm, m being a positive integer. If the non-volatile memory device 100 is a NAND flash memory device, the memory cell array 110 may include memory cell strings (not shown) in which a plurality of memory cells are electrically connected in series.

In one embodiment, first ends of the memory cell strings may be connected to mode select transistors, respectively. The mode select transistors may function as transistors for driving the NAND flash memory device based on a selected one of two operating mechanisms, i.e., a diode-type operating mechanism and a field-effect transistor-type operating mechanism, in the NAND flash memory device having the single architecture. According to an embodiment, the mode select transistors may enable the NAND flash memory device to be driven in the diode-type operating mechanism or the field-effect transistor-type operating mechanism based on values and polarity of a voltage applied to gate electrodes of the mode select transistors. In an example, a reading operation of the NAND flash memory device may be performed according to a selected one of the fore-mentioned two-type reading operation mechanisms while a programming operation of the NAND flash memory device may be performed in the same way for both of the mechanisms. Detailed description thereof will be given below.

A string select transistor for selecting a memory string and a string select line for driving the string select transistor may be coupled with first ends of the memory cell strings. A common source line CSL may be connected to second ends of the memory cell strings. According to some embodiments, a ground select transistor may be further connected to the memory cell strings, and the ground select transistor may be coupled with a ground selection line GSL. Furthermore, first ends of the ground select transistors may be electrically connected to the common source line CSL.

The wordlines WL0 to WLn−1 may be connected to control gate electrodes of memory cells arranged in a column-wise direction, respectively. The bitlines BL1 to BLm may be connected to the first ends of the mode select transistors, respectively.

A plurality of memory cells having control gate electrodes coupled with the respective wordlines WL0 to WLn−1 in a row-wise direction may constitute a logical page, where a number of logical pages may be determined by a storage capacity of the memory cells. For example, according to a level of the storage capacity, one or more of a single level cell (SLC) memory device, in which each memory cell stores 1 bit, a multi level cell (MLC) memory device, in which each memory cell stores 2 bits, an eight level cell (8LC) memory device, in which each memory cell stores 3 bits, and a sixteen level cell (16LC) memory device, in which each memory cell stores 4 bits, may be provided.

Memory cells of the memory cell array 110 may be arranged in a 2D array structure that is disposed substantially parallel to a main surface of a semiconductor substrate or a 3D array structure having a channel perpendicular to a main surface of a semiconductor substrate or one or more memory layers stacked in a vertical direction of the main surface of the semiconductor substrate. For example, the 3D array structure in accordance with an embodiment of the present disclosure may be a channel stacked structure, a straight-shaped bit cost scalable (BiCs) structure, or a pipe-shaped BiCs structure, where various layer selection methods described below may be applied to the structure. However, the above-described structures are merely examples, and embodiments of the present disclosure are not limited thereto.

Memory cells constituting a page may be programmed in a same program cycle. For example, memory cells connected to a wordline WL1 may be programmed to have an identical program state (or have a target value) in the same program cycle. Alternatively, the memory cells connected to the wordline WL1 may be programmed to have different program states, for example, in a single program cycle, a first memory cell may be programmed to have a first program state P1, a second memory cell adjacent to the first memory cell may be programmed to have a second program state P2, and other memory cells may be programmed to have a third program state P3. However, embodiments of the present disclosure are not limited thereto. In accordance with another embodiment, an SLC device has an interleaved architecture, and even-numbered cells and odd-numbered cells may constitute two pages different from each other. For example, a 4 kb SLC device may include wordlines for 65,536 memory cells. Furthermore, in case of an MLC device, since each cell stores one least significant bit (LSB) and one most significant bit (MSB), the MLC device has four pages. For example, in the MLC device, MSB pages and LSB pages on even-numbered bitlines and MSB pages and LSB pages on odd-numbered bitlines may be provided.

The row decoder 120 may drive the mode select transistors via the mode select lines MSL coupled with the mode select transistors. The mode select transistors may be programmable transistors. In this case, a rating mechanism of a data storage device may be determined based on a pre-programming operation or a pre-erasing operation as described below.

Furthermore, the row decoder 120 may select any one of wordlines of a memory block. The row decoder 120 may apply a wordline voltage $V_{WL}$ generated by a voltage generator (not shown) to the selected wordline of the selected memory block. In an example, the row decoder 120 may perform a read operation in a way of a field-effect transistor-type driving operation in which a read voltage $V_{read}$ and a verify voltage $V_{vfy}$ is applied to a selected wordline and a pass voltage $V_{pass}$ is applied to an unselected wordline during the read operation. According to another example, the row decoder 120 may perform a read operation in a way of a positive feedback diode-type driving operation in order to drive the non-volatile memory device 100.

The memory cell array 110 may be addressed by the bitlines BL1 to BLm via the column decoder 140. The read/write circuit 130 may receive data from an external circuit via the column decoder 140.

The read/write circuit 130 may include a page buffer (not shown) and may operate as a sense amplifier or a write driver according to operation modes. However, in the present disclosure, "read/write circuit" and "page buffer" may be used as equivalent terms and shall be understood as interchangeable terms. During a program operation, the read/write circuit 130 transmits a bitline voltage corresponding to data to be stored to a bitline of the cell array 110. During a read operation, the read/write circuit 130 may read out data stored in a selected memory cell via a selected bitline, latch the read-out data, and output the latched data to the external circuit.

The read/write circuit 130 may perform a verification operation in association with a program operation regarding a memory cell in response to a transmission signal transmitted from a control logic 180 and, in response to the transmission signal, may output a result of the verification operation as page buffer signals over a plurality of number of times. In accordance with an embodiment, the read operation of the read/write circuit 130 may be performed based on charge integration using a bitline parasitic capacitor. Furthermore, the read/write circuit 130 may measure a string current or voltage output to a bitline for performing verification during a program operation for initializing string selection transistors based on an incremental step pulse programming (ISPP) technique. A verification technique may be performed by a current sensing circuit coupled with a bitline. In accordance with an embodiment, the current sensing circuit may be provided in the read/write circuit 130.

In an embodiment of the present disclosure, memory cells may be programmed page by page using the ISPP technique on the basis of a verification process for checking whether a threshold voltage of a corresponding memory cell reaches a level of a target voltage. The ISPP technique may be performed by a current sensing circuit (not shown) coupled with the bitlines BL1 to BLm.

A pass/fail verification circuit 150 verifies whether a programmed memory cell and/or string selection transistors are at a desired level time when a program loop count increases. If the programmed memory cell and/or string selection transistors have a desired target level (a threshold value or a target value), it may be determined as a program pass, and the program operation and verification operation on the programmed memory cell and/or string selection transistors are terminated. However, if the programmed memory cell and/or string selection transistors do not reach the target value, it may be determined as a program fail, and the pass/fail verification circuit 150 may generate a count signal (not shown). The pass/fail verification circuit 150 may determine a fail of the program operation, and then transmit the determined result to the control logic 180.

In response to a command CMD, the control logic 180 may control one or more of the row decoder 120, the read/write circuit 130, the column decoder 140, the pass/fail verification circuit 150, a program loop turn detector 160, and a comparator 170 to perform a pulsed program operation and a verification operation based on the ISPP technique.

The program loop turn detector 160 and the comparator 170 may be circuits for determining whether a memory cell to be programmed, a string selection transistor, or both are abnormally slow cells or abnormally fast cells. In other embodiments, the program loop turn detector 160 and the comparator 170 may be omitted.

The control logic 180 may determine whether to terminate or continue a program operation according to the pass/fail result transmitted from the pass/fail verification circuit 150. When the fail result is received from the pass/fail verification circuit 150, the control logic 180 may cause a voltage generator (not shown) to generate a program voltage $V_{pgm}$ increased by $\Delta V_{ISPP}$ and a verification voltage $V_{vfy}$, and a page buffer 130 to proceed a follow-up program loop. On the contrary, when the control logic 180 receives the pass result, a program operation on selected memory cells will be terminated.

In various designs, the control logic 180 may be integrated on the same chip with the memory cell array 110. However, embodiments of the present disclosure are not limited thereto. In an embodiment, the control logic 180 may be implemented in a different chip from the memory cell array 110. For example, as in a solid state drive (SSD), the control logic 180 may be provided at a flash translation layer (FTL), which is an independent chip separated from the memory cell array 110.

Furthermore, although the pass/fail verification circuit 150, the program loop turn detector 160, and the comparator 170 are configured to be separate elements from the control logic 180 as shown in FIG. 1, the present disclosure is not limited thereto. For example, at least one of the pass/fail verification circuit 150, the program loop turn detector 160, and the comparator 170 may be implemented as software or hardware in the control logic 180. Furthermore, at least one of the pass/fail verification circuit 150, the program loop turn detector 160, and the comparator 170 may be omitted, or another circuit component may be added.

Figure 2:
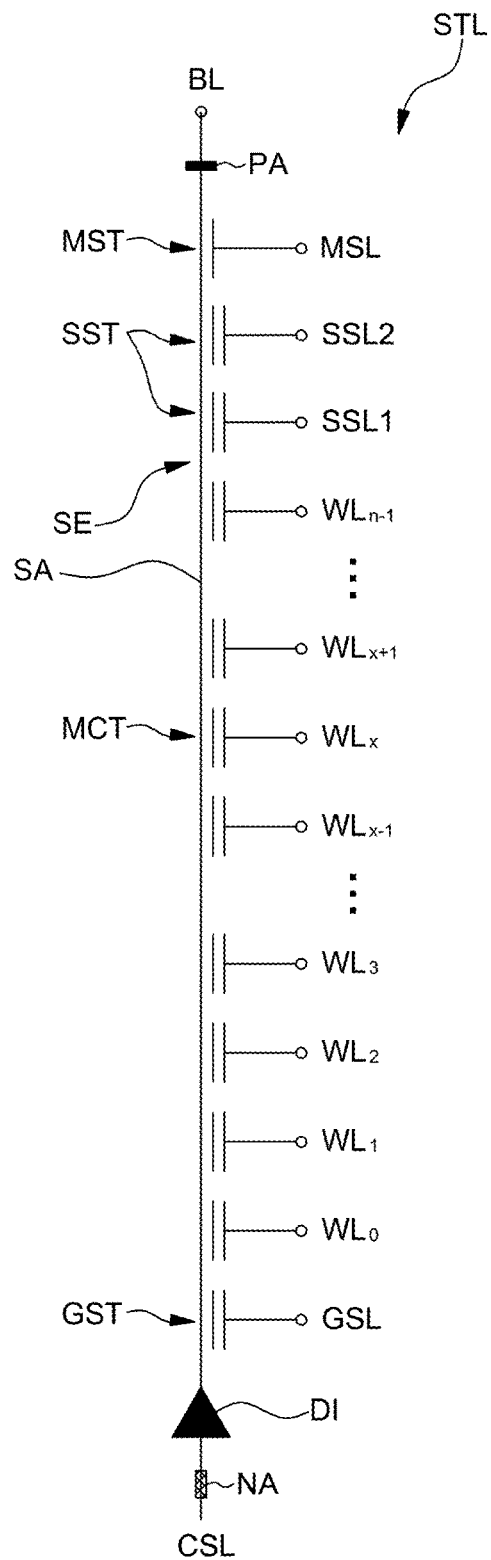
FIG. 2 is an equivalent circuit diagram of a memory string of a memory cell array according to an embodiment of the present disclosure.

FIG. 2 is an equivalent circuit diagram of a memory string STL of a memory cell array according to an embodiment.

Referring to FIG. 2, the memory string STL may include a semiconductor structure SE including a first conductive-type region NA having a first-type conductivity, a second conductive-type region PA having a second-type conductivity opposite to the first-type conductivity, and a semiconductor region SA coupled between the first conductive-type region NA and the second conductive-type region PA. For example, the first conductive-type region NA may have an n-type conductivity, and the second conductive-type region PA may have a p-type conductivity, or vice versa. In other example, the second conductive-type region PA may be replaced with an intrinsic semiconductor region.

The first conductive-type region NA and the second conductive-type region PA may be impurity regions. For example, the first conductive-type region NA may be a heavily doped n-type impurity region, and the second conductive-type region PA may be a heavily doped p-type impurity region or lightly doped p-type impurity region.

The semiconductor region SA between the first conductive-type region NA and the second conductive-type region PA may include an intrinsic semiconductor region or a lightly doped first conductive-type impurity region. Charged carriers may flow through the semiconductor region SA between the first conductive-type region NA and the second conductive-type region PA.

The first conductive-type region NA and the second conductive-type region PA may be disposed at a first end and a second end of the semiconductor region SA, respectively. The first conductive-type region NA, the second conductive-type region PA, and the semiconductor region SA may be integrated into a single semiconductor structure or may be formed separately from one another. However, the present disclosure is not limited thereto.

The first conductive-type region NA may be electrically connected to a first wire, e.g., a common source line CSL. The second conductive-type region PA, together with a portion of the semiconductor region SA that is adjacent to the second conductive-type region PA, may be electrically connected to a second wire, e.g., a bitline BL. Therefore, a common contact connects the second wire (e.g., the bitline BL) to both of the second conductive-type region PA and the portion of the semiconductor region SA that is adjacent to the second conductive-type region PA. Hereinafter, the portion of the semiconductor region SA may be referred to as "neighbouring portion", and the common contact may be referred to as an "ambipolar contact" in the present specification. According to an embodiment of the present disclosure, the ambipolar contact may be disposed between the bitline BL and the memory string STL.

The ambipolar contact may be provided where the bitline BL extends from the second conductive-type region PA of the semiconductor structure SE toward the portion of the semiconductor region SA. That is, the ambipolar contact may be disposed where a portion of the second wire commonly contacts the second conductive-type region PA and the neighbouring portion that is adjacent to the second conductive-type region PA. When the second conductive-type region PA is replaced with an intrinsic semiconductor, i.e., an end of the semiconductor structure SE corresponding to the second conductive-type region PA remains undoped. The ambipolar contact may be provided where a portion of the second wire commonly contacts the undoped end of the semiconductor structure SE and a portion of the semiconductor region i.e., neighbouring portion that is adjacent to the undoped end of the semiconductor structure SE.

A mode select transistor MST is coupled to the portion of the semiconductor region SA that is adjacent to the second conductive-type region PA. The mode select transistor MST may be a conventional field effect transistor, and may use the portion of the semiconductor region SA adjacent to the second conductive-type region PA as a channel region. A gate insulation layer may be disposed between the portion of the semiconductor region SA that is adjacent to the second conductive-type region PA and a gate electrode of the mode select transistor MST. The gate electrode of the mode select transistor MST may be electrically coupled to a mode select line MSL.

When an operation voltage is applied to the gate electrode of the mode select transistor MST via the mode select line MSL, holes or electrons may be generated in the channel region of the mode select transistor MST based on a charge-inducing mechanism, such as inversion or accumulation of charges in the portion of the semiconductor region SA according to a polarity of the operation voltage.

For example, when the second impurity of the second conductive-type region PA is a p-type impurity, and the mode select transistor MST is an NMOS transistor, a negative voltage may be applied to the gate electrode of the mode select transistor MST in order to induce hole charge carriers in a channel region of the mode select transistor MST. That is, holes may be injected from the second conductive-type region PA to the portion of the semiconductor region SA that is adjacent to the second conductive-type region PA when the operation voltage is negative. Accordingly, a hole current can flow between the first wire CSL and the second wire (e.g., a bitline BL) via the semiconductor structure SE, due to holes injected from the second conductive-type region PA and additional holes tunnelled from the neighbouring portion by accumulation of holes therein. Operation of the memory string STL based on the above hole current will be referred to as a "positive feedback diode-type operation," herein.

In contrast, during another operation of the memory string STL, a positive voltage may be applied to the gate electrode of the mode select transistor MST in order to drive the memory string STL by negative charge carriers, i.e., electrons. Electrons may be generated in the channel region of the mode select transistor MST when the operation voltage is positive. That is, the portion of the semiconductor region SA adjacent to the second conductive-type region PA may be turned on, and therefore, an electron current can flow between the first wire CSL and the second wire and through the semiconductor structure SE using electron charge carriers. Operation of the memory string STL based on the electron current will be referred to as a "field-effect transistor-type operation," herein.

The memory string STL may include one or more string select transistors SST, which each switch an electrical connection between the bitline BL and the memory string STL, in order to select the memory string STL. That is, the string select transistor SST may electrically connect or disconnect the bitline BL and the memory string STL. The one or more string select transistors SST may be provided according to array structures of the memory string STL. A memory layer of a selected memory string STL may be turned on or off via string select lines SSL1 and SSL2, which are coupled with the string select transistors SST.

In some embodiments, dummy string select transistors (not pictured) may be further included in the memory string STL. The dummy select transistors may initialize the string select transistors SST or select the memory string STL with the assistance of one of the string select transistors SST. In an embodiment, each of the string select transistors SST (including the dummy string select transistors) may be a suitable multi-level transistor capable of having a plurality of states, e.g., a plurality of threshold values.

The memory string STL may include a plurality of memory cell transistors MCT, which are coupled to the semiconductor region SA of the semiconductor structure SE. In an embodiment, the memory cell transistors MCT may be connected to one another in series, and may be part of a NAND flash memory architecture. Gate electrodes of the memory cell transistors MCT may be electrically connected to corresponding wordlines $WL_0$ to $WL_{n-1}$, respectively. The memory cell transistors MCT may be junctionless or junction-free transistors. Impurity regions corresponding to source/drain regions between adjacent memory cell transistors MCT may be omitted from the memory string STL. That is, in this embodiment, a process of doping impurity into a portion between the adjacent memory cell transistors MCT, which has been used to form conventional source/drain regions, may be omitted.

Each of the memory cell transistors MCT may include a data storage layer for storing data. In some embodiments, each of the mode select transistors MST, the string select transistors SST, and the dummy string select transistor may be programmable transistors, and may also include a data storage layer. In addition, like the data storage layers of the memory cell transistors MCT, each of the mode select transistors MST, the string select transistors SST, and the dummy string select transistor may have the same stacked structure of materials as that of the memory cell transistors MCT.

A ground select transistor GST may be further provided in the memory string STL. A gate select line GSL may be electrically coupled with a gate electrode of the ground select transistor GST, and thus the ground select transistor GST may be turned on or off by controlling the gate select line GSL. The ground select transistor GST may also be referred to as a "string select transistor." However, the present disclosure shall not be limited by such terms.

Figure 3A:
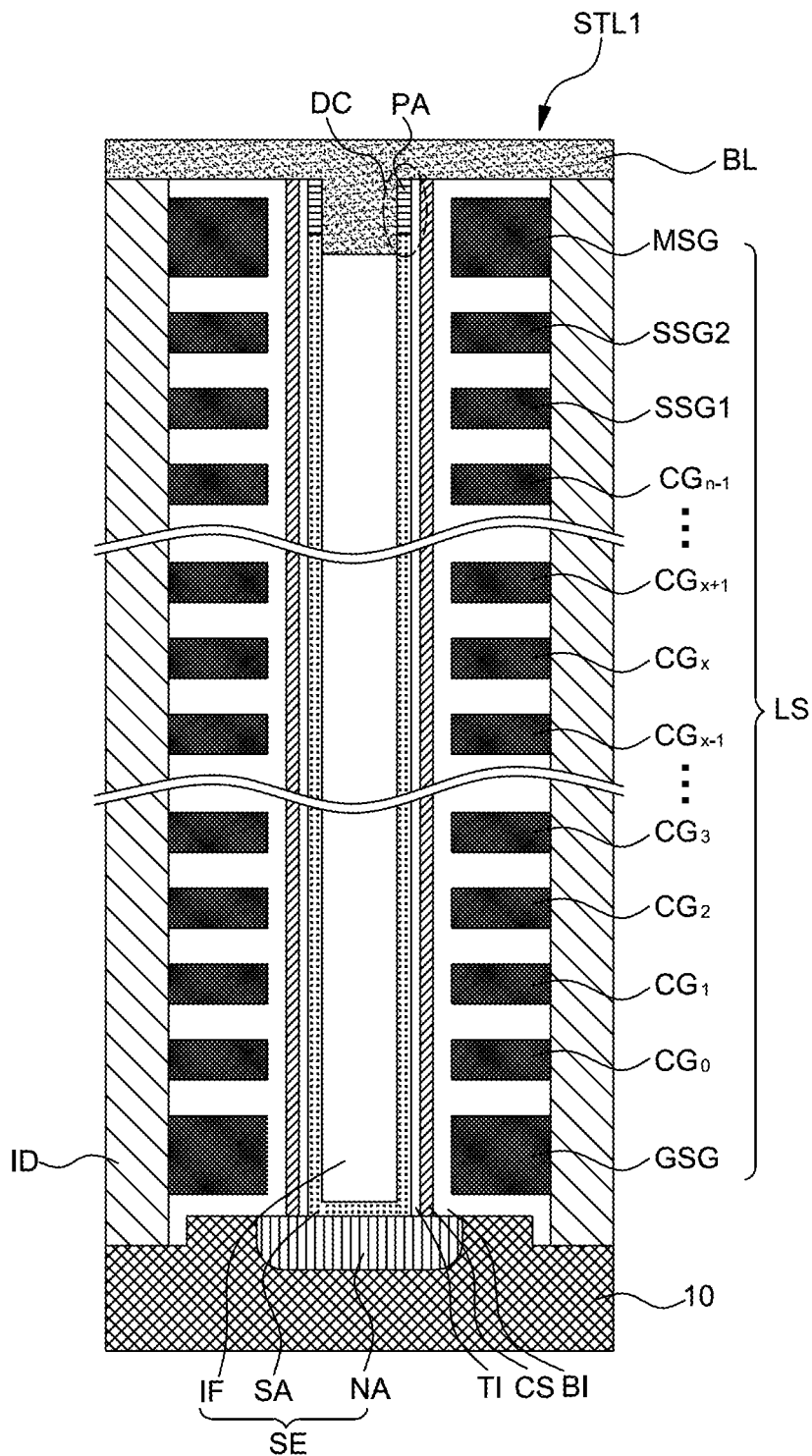
FIG. 3A is a cross-sectional diagram of a memory string according to an embodiment of the present disclosure.
Figure 3B:
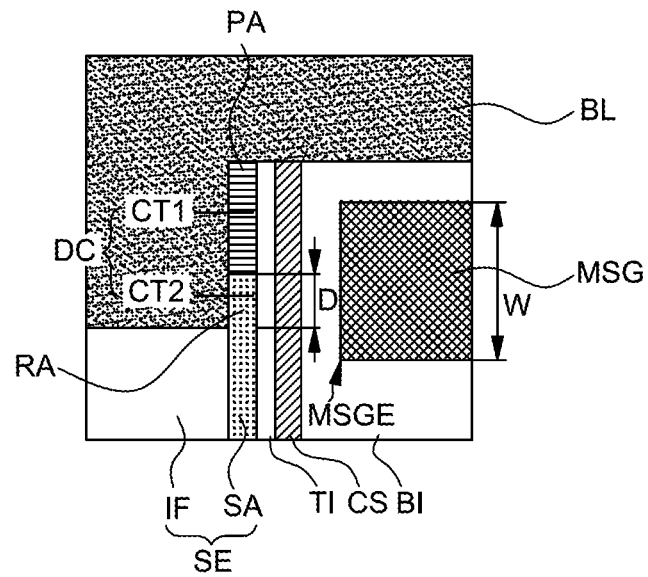
FIG. 3B is a magnified diagram of an ambipolar contact shown in an area of FIG. 3A indicated with a dashed line.

FIG. 3A is a cross-sectional diagram of a memory string STL1 according to an embodiment of the present disclosure. FIG. 3B is a magnified diagram of an ambipolar contact DC shown in an area of FIG. 3A that is indicated with a dashed line.

Referring to FIG. 3A, the memory string STL1 is a memory string that includes a vertical-type channel. The memory string STL1 may be disposed on a substrate 10. The substrate 10 may be any of a semiconductor substrate, such as a silicon (Si) monocrystalline substrate, a compound semiconductor substrate, a silicon on insulator (SOI) substrate, and a strained substrate. However, the previously mentioned materials are merely examples, and the substrate 10 may additionally or alternatively be any of a ceramic substrate, a flexible polymer substrate when the memory string STL1 is part of a flexible device, and a fabric substrate when the memory string STL1 is part of a wearable device. However, the present disclosure is not limited thereto.

The memory string STL1 includes a semiconductor structure SE, which vertically extends from a main surface of the substrate 10. The semiconductor structure SE may be disposed against a first conductive-type region NA. The first conductive-type region NA may include a first impurity, and may be disposed along a surface of the substrate 10. For example, the first conductive-type region NA may be an n-type region, and the first conductive-type region NA may be provided by heavily doping an n-type impurity into the substrate 10. The first conductive-type region NA may be electrically connected to a first wire, e.g., a common source line (not illustrated).

The semiconductor structure SE includes a second conductive-type region PA that is spaced apart from the first conductive-type region NA, and that includes a second impurity, which is an opposite type of impurity than the first impurity of the first conductive-type region NA. The second conductive-type region PA may be a p-type region, and may be provided by heavily or lightly doping a p-type impurity into the semiconductor structure SE. In another example, the second conductivity-type region PA may be replaced with an intrinsic semiconductor region. To this end, instead of the second conductivity-type region PA, the end of the semiconductor structure corresponding to the second conductivity-type region PA may remain undoped to be intrinsic.

The semiconductor structure SE includes a semiconductor region SA, which is disposed between the first conductive-type region NA and the second conductive-type region PA. The semiconductor region SA may include an intrinsic semiconductor region or a lightly doped first conductive-type impurity region. The second conductive-type region PA and the semiconductor region SA may be integrated into a single semiconductor layer or a single semiconductor body. The second conductive-type region PA or the semiconductor region SA may be formed by doping a second conductive-type impurity into end portions of the semiconductor layer or the semiconductor body.

In the embodiment shown in FIG. 3A, the second conductive-type region PA and the semiconductor region SA may be part of an integrated semiconductor layer structure. The semiconductor layer structure may have a cylindrical shape that forms a vertical-type channel. A bottom portion of the semiconductor layer structure may extend to a surface of the substrate 10. For example, as depicted in FIG. 3A, the semiconductor layer structure may be shaped like a hollow cylinder with a U-shaped vertical cross section. The bottom portion of the semiconductor layer structure may contact the first conductive-type region NA, and thus an electrical connection between the semiconductor region SA and the first conductive-type region NA may be obtained.

The semiconductor region SA and the second conductive-type region PA of the semiconductor structure SE may include any of poly-silicon, silicon single crystal, a non-silicon-type compound semiconductor, a carbon-based material, a polymer-based material, and another channel material. Such materials may be suitably selected based on process sequences and/or temperatures used to form the memory string STL1. However, the present disclosure is not limited thereto.

Furthermore, the semiconductor structure SE is not limited to a single material. The semiconductor structure SE may have a stacked structure, in which semiconductor materials having different energy band-gaps are stacked. For example, Korean Patent Registration No. 1,538,071, which is incorporated by reference into the present specification in its entirety, describes embodiments of the stacked structure of the semiconductor structure SE. In an embodiment, the semiconductor structure SE may have a hollow cylindrical structure with two open ends, such that the bottom portion of the semiconductor region SA of the semiconductor structure SE may not extend to the surface of the substrate 10.

Referring to FIGS. 3A and 3B, an inner space of the semiconductor structure SE may be filled with an insulator IF. In an embodiment, the insulator IF is partially recessed toward the substrate 10 from an end of the semiconductor structure SE that includes the second conductive-type region PA. Thus, a surface of the second conductive-type region PA and a surface of an apposed or neighbouring portion RA of the semiconductor region SA may be exposed. The neighbouring portion RA may be a part of the semiconductor region SA that is adjacent to the second conductive-type region PA, and may be disposed at an inner side of the hollow cylindrical structure. A length D of the neighbouring portion RA may be determined based on a width W of a mode select gate electrode MSG. An end portion of the neighbouring portion RA may be aligned with an edge portion MSGE of the mode select gate electrode MSG, or may be arranged inside a portion of the semiconductor region SA, such that the end portion of the neighbouring portion RA overlaps the mode select gate electrode MSGE.

A combination of an electrical contact CT1 between a second wire BL and the second conductive-type region PA, and an electrical contact CT2 between the second wire BL and an inner surface of the neighbouring portion RA of the semiconductor region SA, may constitute an ambipolar contact DC. In other example, when the second conductive-type region PA is replaced with an intrinsic semiconductor, i.e., an end of the semiconductor structure SE corresponding to the second conductive-type region PA remains undoped. The ambipolar contact may be provided by a first electrical contact between a second wire BL and the undoped end of the semiconductor structure SE and a second electrical contact between the second wire BL and an inner surface of the neighbouring portion RA. The second wire may be a bitline BL. The ambipolar contact DC allows an operating current to flow through the semiconductor region SA due to hole charge carriers or electron charge carriers. The type of charge carriers in the semiconductor region SA may be selected based on the operating mode of a semiconductor memory device including the ambipolar contact DC. That is, in one operating mode of the semiconductor device, the operating current may flow through the semiconductor region SA using hole charge carriers, and in another operating mode of the semiconductor device, the operating current may flow through the semiconductor region SA using electron charge carriers.

Although, in the illustrated example of FIG. 3B, the ambipolar contact DC of the second wire (e.g., the bitline BL) is disposed inside of the hollow cylindrical structure of the semiconductor structure SE, the present disclosure is not limited thereto. In another embodiment, the second wire BL may contact the second conductive-type region PA and the neighbouring portion RA on an outside surface of the semiconductor layer of the semiconductor structure SE, and thus the ambipolar contact DC may be disposed on an outside surface of the semiconductor structure SE.

In another embodiment, the semiconductor structure SE may have a solid-type semiconductor pillar structure including a vertical-type channel. In this case, a conductive layer, which contacts the second conductive-type region PA and the neighbouring portion RA, may be disposed against an outer surface of the semiconductor pillar structure. An electrical contact between the conductive layer, which may be connected to a bitline, and the semiconductor structure SE may be an ambipolar contact.

In another embodiment, when the semiconductor structure SE has a solid pillar shape, a penetrating hole may be formed in the semiconductor structure SE, and may have a depth extending from an end of the second conductive-type region PA to the neighbouring portion RA. The penetrating hole may be filled with a conductive layer, which may be used to form the bitline BL. Accordingly, an electrical contact between the bitline BL and the semiconductor structure SE may be the ambipolar contact DC.

Around the semiconductor structure SE, a stacked structure LS is provided. The stacked structure LS may include a gate electrode MSG of a mode select transistor, gate electrodes SSG1 and SSG2 of a string select transistor, control gate electrodes $CG_0$ to $CG_{n-1}$ of memory cell transistors, and a gate electrode GSG of a ground select transistor, which may be electrically separated from each other by a blocking insulation layer BI. The semiconductor structure SE may be provided by forming a through hole in the stacked structure LS, from a top of the stacked structure LS to the surface of the substrate 10, and then forming a semiconductor layer structure, which includes the semiconductor region SA, the second conductive-type region PA, and the insulation layer IF, inside of the through hole.

The gate electrode MSG of the mode select transistor may be located to the side of the neighbouring portion RA of the semiconductor region SA, and may overlap the neighbouring portion RA of the semiconductor region SA. The blocking insulation layer BI may be coupled between the gate electrode MSG of the mode select transistor and the neighbouring portion RA. As a result, electron charge carriers or hole charge carriers may be induced in the neighbouring portion RA based on a magnitude and polarity of a voltage applied to the gate electrode MSG via a mode select line.

The induced electron charge carriers or hole charge carriers may transform the semiconductor region SA into an electrically doped region. The memory string STL1 including the gate electrode MSG may operate based on characteristics of a diode (refer to DI of FIG. 2) or a field-effect transistor, that is, in first and second modes.

According to an embodiment, the mode select transistor may share data storage layers with memory cell transistors, as described below. FIG. 3A illustrates a configuration in which data storage layers of memory cell transistors are stacked between the gate electrode MSG and the neighbouring portion RA. The data storage layers include a tunnel insulation layer TI, a charge storage layer CS, and the blocking insulation layer BI. As described above, when the mode select transistor shares the data storage layers with the memory cell transistors, the mode select transistor may also be programmed and erased (optionally, soft-erased), as described below. As a result of performing a pre-programming operation or a pre-erasing operation, which are described below with reference to FIGS. 8A and 8B, the semiconductor region SA may be effectively electrically doped. Accordingly, during each memory operation under the same bias condition, a greater on-current may flow through the semiconductor region SA after the pre-programming and pre-erasing operations are performed, as compared to the on-current that may flow through the semiconductor region SA when the pre-programming operation and the pre-erasing operation are not implemented. Therefore, operation characteristics of a non-volatile memory device including the semiconductor region SA may be enhanced. The pre-programming operation or the pre-erasing operation may be accompanied by an initialization or a formatting process of a semiconductor memory device including the ambipolar contact DC.

A plurality of memory cell transistors, which respectively include control gate electrodes $CG_0$ to $CG_{n-1}$, are formed on the semiconductor region SA. The data storage layers may be sandwiched between the semiconductor region SA and the control gate electrodes $CG_0$ to $CG_{n-1}$. The control gate electrodes $CG_0$ to $CG_{n-1}$ may be formed from a conductive layer including any conductive material, such as a metal (e.g., tungsten), which may be used to form a metal gate, a heavily doped polysilicon, a metal silicide, or metal nitride. However, the present disclosure is not limited thereto. The control gate electrodes $CG_0$ to $CG_{n-1}$ may have a gate all around (GAA) structure that encircles the semiconductor structure SE, but the present disclosure is not limited thereto. For example, the control gate electrodes $CG_0$ to $CG_{n-1}$ may have a double gate structure or a vertical gate structure, according to embodiments of the present disclosure.

Among the data storage layers of the memory cell transistors, the charge storage layer CS, which may be a floating gate or a charge trapping layer, is insulated by the tunnel insulation layer TI and the blocking insulation layer BI. The charge storage layer CS may function as an information storage layer. For example, a plurality of memory cells including the memory cell transistors may each include a control gate electrode, a blocking insulation layer, a charge trapping layer, a tunnel insulation layer, and a semiconductor structure in ordered stacked, such as a polysilicon-silicon dioxide-silicon nitride-silicon dioxide-silicon (SONOS) structure, a polysilicon-alumina-silicon nitride-silicon dioxide-silicon (SANOS) structure, a tantalum or titanium nitride-alumina-silicon nitride-silicon dioxide-silicon (TANOS) structure, a metal-alumina-silicon nitride-silicon dioxide-silicon (MANOS) structure, or a metal-alumina-silicon nitride-band engineered oxide-silicon (Be-MANOS) structure. The above silicon nitride as the charge trapping layer is merely an example, and the present disclosure is not limited thereto. The charge storage layer CS may include any one of various other candidate materials other than silicon nitride.

In the embodiment shown in FIG. 3A, the tunnel insulation layer TI and the charge storage layer CS vertically extend along a surface of the semiconductor structure SE, and the blocking insulation layer BI electrically separates the control gate electrodes $CG_0$ to $CG_{n-1}$ from one another. However, the stacked structure including the tunnel insulation layer TI, the charge storage layer CS, and the blocking insulation layer BI, is not limited to the embodiment shown in FIG. 3A, and may vary according to various fabrication processes or materials used to form the stacked structure. For example, the stacked structure may have a SMArT (Stacked Memory Array Transistor) structure, as disclosed in the paper "Device Considerations for High Density and Highly Reliable 3D NAND Flash Cell in Near Future," by Eun-Seok Choi et al., published in 2012 IEEE, which is herein incorporated by reference in its entirety. That is, the stacked control gate electrodes $CG_0$ to $CG_{n-1}$ may be electrically separated from one another by a silicon oxide ($SiO_2$) layer that is formed separately from the tunnel insulation layer TI, the charge storage layer CS, and the blocking insulation layer BI.

In another example, the stacked structure may have a TCAT (Terabit Cell Array Transistor) structure, as disclosed in the paper "Vertical cell Array using TCAT (Terabit Cell Array Transistor) Technology for Ultra High Density NAND Flash Memory," by Jang, J. et al., published in 2009 Symposium on VLSI Technology Digest of Technical Papers, which is herein incorporated by reference in its entirety. That is, the stacked control gate electrodes $CG_0$ to $CG_{n-1}$ may be electrically separated from one another by an additional charge trapping layer and an additional blocking insulation layer. The charge trapping layer and the blocking insulation layer may have concave shapes, in embodiments of the present disclosure.

According to another embodiment, the stacked structure may include any of a BitCost Scalable (BiCS) structure, a p-BiCs structure, a vertical-recess-array-transistor (VRAT) structure, and a vertical gate NAND structure. However, the present disclosure is not limited thereto.

According to an embodiment, the memory string STL1 may further include one or more string select transistors and/or a ground select transistor coupled with the semiconductor structure SE. In the case illustrated in FIG. 3A, first and second string select transistors may include gate electrodes SSG1 and SSG2, and a ground select transistor may include a gate electrode GSG, and the first and second string select transistors and the ground select transistor may share the semiconductor region SA of the semiconductor structure SE. The gate electrodes SSG1, SSG2, and GSG may be formed on the gate insulation layer, and the gate insulation layer may be sandwiched between semiconductor region SA of the semiconductor structure SE and the gate electrodes SSG1, SSG2, and GSG.

Figure 4:
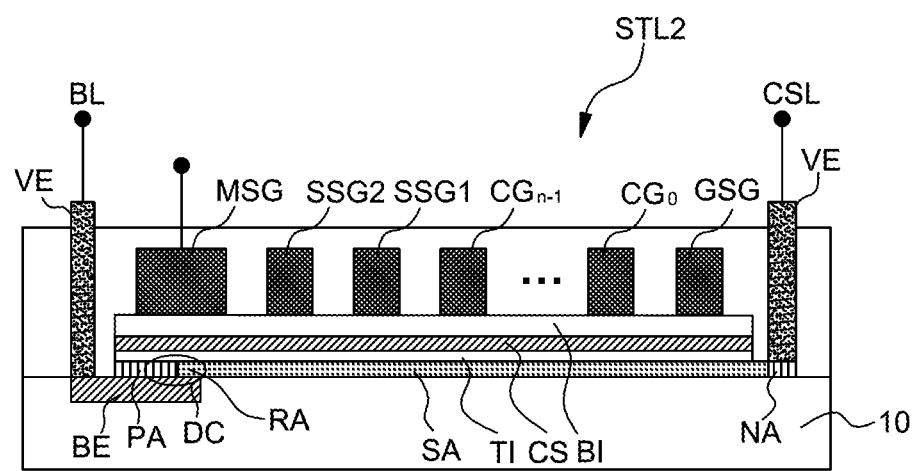
FIG. 4 is a cross-sectional diagram showing a memory string according to another embodiment of the present disclosure.

FIG. 4 is a cross-sectional diagram showing a memory string STL2 according to another embodiment. In FIG. 4, for components of the memory string STL2 that are denoted by identical reference numerals to the components of the memory strings STL and STL1 shown in FIGS. 1 through 3B, the above descriptions of the components of the memory strings STL and STL1 shown in FIGS. 1 through 3B may be referenced, unless descriptions above and below are contradictory.

Referring to FIG. 4, the memory string STL2 includes a horizontal-type channel. The memory string STL2 may include a semiconductor region SA, which is part of a semiconductor structure, horizontally extending across a main surface of a substrate 10. The semiconductor region SA may be an active region of the substrate 10. When the semiconductor region SA is part of a channel-stacked 3D memory device (refer to FIG. 7B), the semiconductor region SA may be a line-patterned semiconductor layer, horizontally stacked on the substrate 10.

The semiconductor structure may include a first conductive-type region NA. The first conductive-type region NA may include a first conductive-type impurity, and may be disposed at a surface of the substrate 10. For example, the first conductive-type region NA may be an n-type region provided by heavily doping an n-type impurity into the semiconductor structure. The first conductive-type region NA may be electrically connected to a first wire, e.g., a common source line CSL. A wire structure VE, such as a via conductor, may electrically interconnect the common source line CSL and the first conductive-type region NA.

The semiconductor structure may also include a second conductive-type region PA that is spaced apart from the first conductive-type region NA and that includes a second impurity with an opposite conductive-type to the first impurity in the first conductive-type region NA. The second conductive-type region PA may be a p-type region and may be provided by heavily or lightly doping a p-type impurity into the semiconductor structure. In other example, the second conductive-type region PA may be replaced with an intrinsic semiconductor region.

The semiconductor structure may further include a semiconductor region SA, which is disposed between the first conductive-type region NA and the second conductive-type region PA. The semiconductor region SA may include an intrinsic semiconductor region or a lightly doped impurity region having the same impurity type as the first conductive-type region NA. According to an embodiment, the first conductive-type region NA, the second conductive-type region PA, and the semiconductor region SA may be integrated into a single semiconductor structure that is provided in or on an active surface of the substrate 10.

In order to form an ambipolar contact DC between the second conductive-type region PA and a neighbouring portion RA adjacent to the second conductive-type region PA, a conductive layer, such as a buried electrode BE, may be disposed against a bottom surface of the second conductive-type region PA and a bottom surface of the neighbouring portion RA. The buried electrode BE may include heavily doped poly-silicon doped with the first conductive-type impurity, a metal, or a metal compound, such as a metal silicide or metal nitride. However, the present disclosure is not limited thereto. The buried electrode BE may be electrically connected to a bitline BL by a via conductor VE.

A gate electrode MSG of a mode select transistor is vertically aligned with the neighbouring portion RA, whereas gate electrodes SSG1 and SSG2 of string select transistors, control gate electrodes $CG_0$ to $CG_{n-1}$ of memory cell transistors, and a gate electrode GSG of a ground select transistor may be vertically aligned with the semiconductor region SA. The gate electrode MSG, the gate electrodes SSG1 and SSG2, the control gate electrodes $CG_0$ to $CG_{n-1}$, and the gate electrode GSG may be electrically separated from one another by an insulation layer. The number of string select transistors illustrated in FIG. 4 is merely an example, and the present disclosure is not limited thereto.

Furthermore, a dummy string select transistor (not illustrated) may further be formed near the common source line CSL.

A tunnel insulation layer TI, a charge storage layer CS, and a blocking insulation layer BI of the memory cell transistors may be stacked between the gate electrode MSG and the neighbouring portion RA. The neighbouring portion RA may be vertically overlapped with the gate electrode MSG. The charge storage layer CS may function as a data storage layer of the memory cell transistors, and may be insulated by the tunnel insulation layer TI and the blocking insulation layer BI. The charge storage layer CS may be a floating gate or a charge-trapping layer. As described above, when the mode select transistors share the same data storage layer as the memory cell transistors, the mode select transistors may be programmed and erased. As a result, by performing a pre-programming operation or a pre-erasing operation (described below with reference to FIGS. 8A and 8B), a read operation or a write operation of a non-volatile memory device including the memory string STL2 may be enhanced. In another embodiment, the mode select transistors may be a conventional field effect transistor, and may include only a single gate insulation layer between the neighbouring portion RA and the mode select gate electrode MSG.

A suitable data storage layer structure, such as the data storage layer structure of FIG. 4 including the tunnel insulation layer TI, the charge storage layer CS, and the blocking insulation layer BI, may extend horizontally along the semiconductor region SA. The suitable data storage layer structure depicted in FIG. 4 is different from a vertical channel TCAT structure, in which the control gate electrodes $CG_0$ to $CG_{n-1}$ are electrically separated by the data storage layer structure. However, as described above, the memory string STL2 may include a data storage layer structure that is similar to the TCAT structure, and may include a charge trapping layer and a blocking insulation layer that have concave shapes. The control gate electrodes $CG_0$ to $CG_{n-1}$ may include a metal or a metal silicide, but the present disclosure is not limited thereto.

Furthermore, according to an embodiment, string select transistors coupled with a semiconductor structure in the memory string STL2 may share the data storage layer structure. In this case, the string select transistors may be programmed to have threshold voltages different from one another in order to select a memory layer. However, in another embodiment, the string select transistors may be conventional field effect transistors including gate insulation layers. A ground select transistor in the memory string STL2 may also share the data storage layer structure, and may use the data storage layer as an insulation layer or a common gate insulation layer, like the string select transistor.

Figure 5:
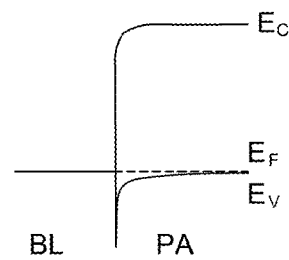
FIG. 5 is an energy band diagram illustrating electrical characteristics of an ohmic contact of the ambipolar contact according to an embodiment of the present disclosure.
Figure 6A:
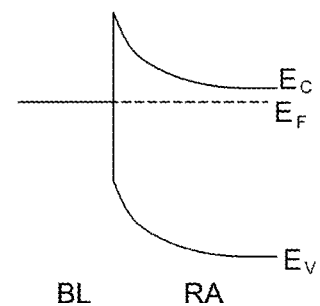
FIGS. 6A through 6C are energy band diagrams illustrating electrical characteristics of a Schottky junction contact of the ambipolar contact.
Figure 6B:
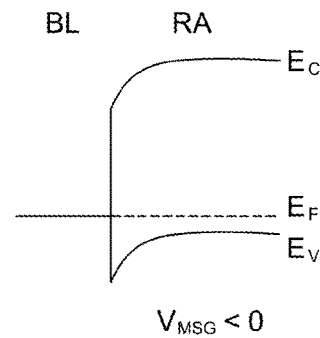
Figure 6C:
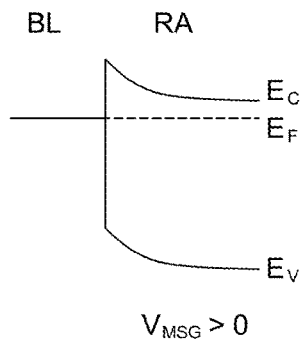

FIG. 5 is an energy band diagram illustrating electrical characteristics of an ohmic contact of an ambipolar contact according to an embodiment. For example, FIG. 5 may illustrate electrical characteristics of the ohmic contact CT1 of the ambipolar contact DC described above with reference to FIG. 3B. FIGS. 6A through 6C are energy band diagrams for illustrating electrical characteristics of a Schottky junction contact of an ambipolar contact, such as the Schottky junction contact CT2 of the ambipolar contact DC described above with reference to FIG. 3B.

Referring to FIGS. 3B and 5, the ohmic contact CT1 of the ambipolar contact DC may be a first contact between the bitline BL and the second conductive-type region PA. The majority carriers, e.g., hole charge carriers, of the second conductive-type region PA may flow through the semiconductor region SA regardless of a bias or a polarity applied between the bitline BL (i.e., the second wire) and the common source line CSL (i.e., the first wire). When the second conductive-type region PA is a p-type region, the second conductive-type region PA may become a source of hole charge carriers that will flow through the semiconductor region SA. A new mechanism, which can replace a conventional gate-induced drain leakage (GIDL) of generating hole charges during an operation for erasing a memory cell transistor, may be utilized using this design, and thus a low power and high speed non-volatile memory device may be implemented.

The Schottky junction contact CT2 of the ambipolar contact DC may be provided by a contact between the bitline BL and the neighbouring portion RA. The Schottky junction contact CT2 provides a Schottky barrier between the bitline BL and the neighbouring portion RA.

FIG. 6A shows that a high-energy barrier may be formed at the Schottky junction contact CT2, which prevents electron charge carriers from moving in a direction from the neighbouring portion RA toward the bitline BL. However, the size of the energy barrier may be adjusted based on a magnitude or a polarity of a voltage applied to a gate electrode MSG of a mode select transistor coupled to the neighbouring portion RA, and thus, a current flowing between the bitline BL and the semiconductor region SA may be effectively controlled. For example, the Schottky junction contact CT2 may be rectified and turned on, such that a current may pass through the Schottky junction contact CT2, by controlling the electron charge carriers at the Schottky junction contact CT2.

For example, as shown in FIG. 6B, when a negative voltage ($V_{MSG}<0$) is applied to the mode select gate electrode MSG, an energy barrier against hole charge carriers increases at the Schottky junction contact CT2. Thus, an amount of a current based on the hole charge carriers, which flows from the second conductive-type region PA to the semiconductor region SA via the neighbouring portion RA, increases. Accordingly, an operation performance for an erase operation or a read operation of a memory cell transistor including the ambipolar contact DC may be enhanced.

As shown in FIG. 6C, when a positive voltage ($V_{MSG}>0$) is applied to the mode select gate electrode MSG, the energy barrier against electron charge carriers decreases. Therefore, an amount of the current based on the electron charge carriers, which flows from the semiconductor region SA to the bitline BL via the neighbouring portion RA, increases. Accordingly, an operation performance for an erase operation or a read operation of the memory cell transistor including the ambipolar contact DC may be enhanced.

Figure 7A:
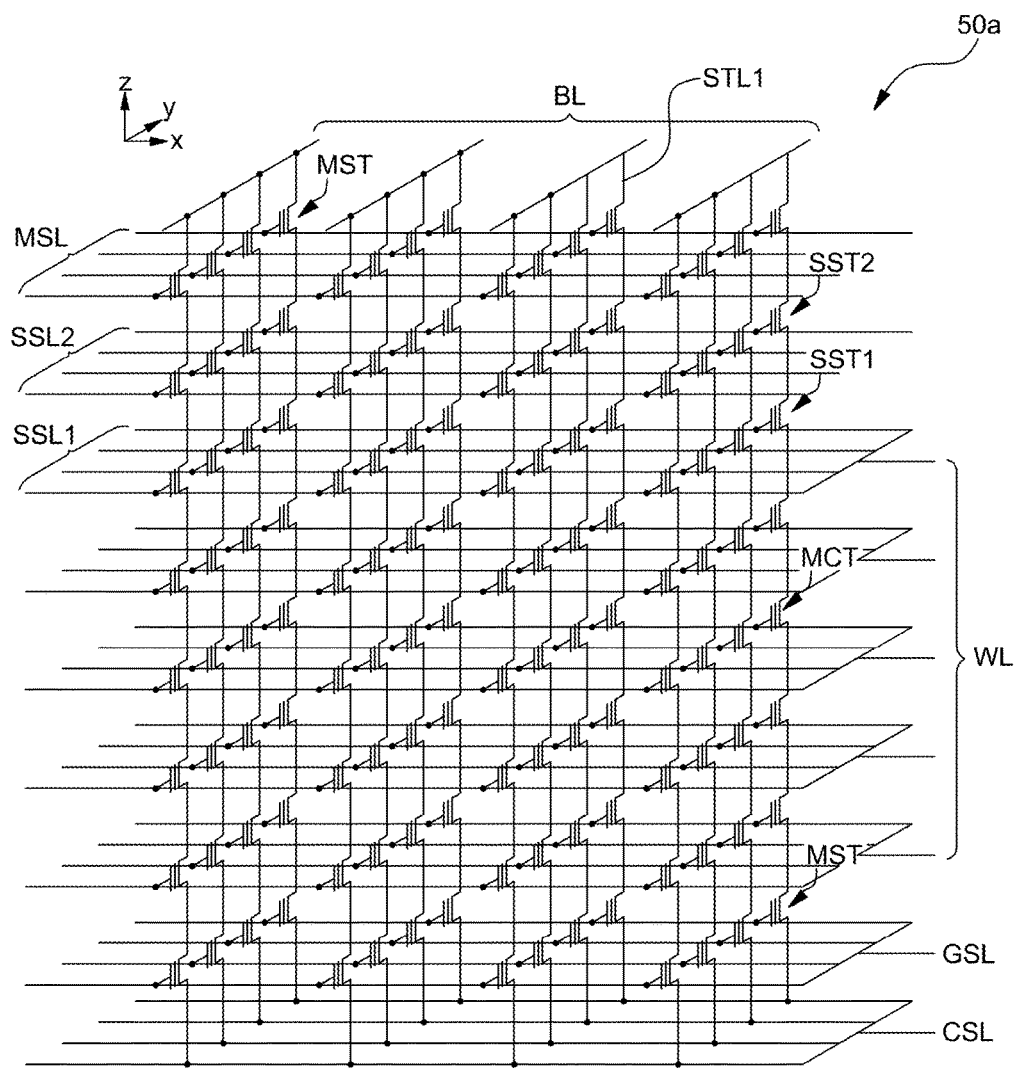
FIGS. 7A and 7B are equivalent circuit diagrams illustrating 3D non-volatile memory devices according to various embodiments of the present disclosure.
Figure 7B:
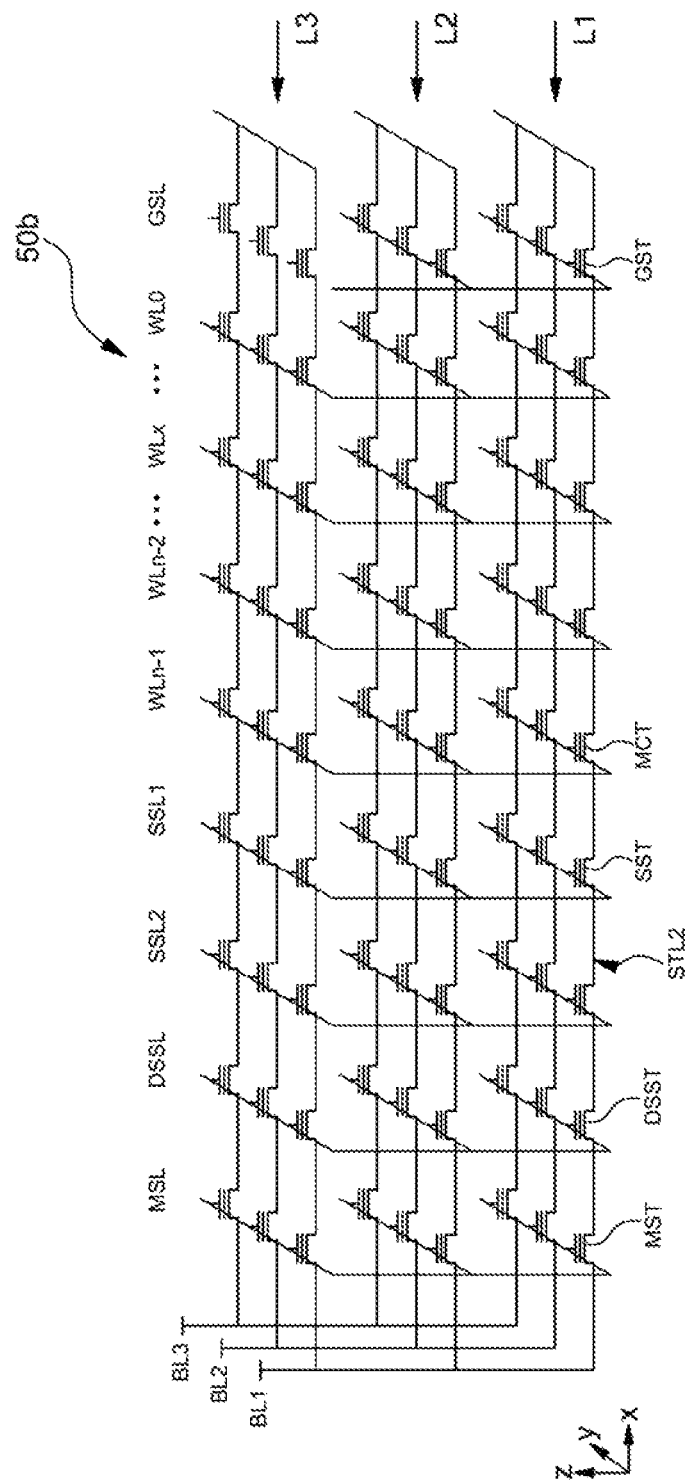

FIGS. 7A and 7B are equivalent circuit diagrams illustrating 3D non-volatile memory devices 50a and 50b according to various embodiments of the present disclosure.

Referring to FIGS. 3A and 7A, a plurality of memory strings STL1 may respectively include channels vertically extending from the main surface of the substrate 10, and the memory strings STL1 may be arranged on the substrate 10 in rows and columns. First ends of the memory strings STL1 include first conductive-type regions, such as the first conductive-type region NA of FIG. 3A. The first conductive-type regions are electrically connected to a common source line CSL, which is also referred to as a first wire. Second ends of the memory strings STL1 include second conductive-type regions, such as the second conductive-type region PA of FIG. 3A. The second conductive-type regions are respectively connected to bitlines BL, which are also referred to as second wires.

Each memory string may include two string select transistors SST1 and SST2, which are each transistors for bit selectivity. However, FIG. 7A merely illustrates an example of a memory string structure, and in another embodiment, each memory string may instead include one string select transistor or three or more string select transistors.

A mode select transistor MST is provided between the bitlines BL and each of the memory strings STL1. The mode select transistors MST enable the 3D non-volatile memory device 50a to selectively drive one of two memory operating mechanisms by using an ambipolar contact, such as the ambipolar contact DC of FIG. 3B, in a single architecture of the 3D non-volatile memory device 50a. According to an embodiment of the present disclosure, a first operating mechanism and a second operating mechanism may be selectively driven within a single chip or a single device. The first operating mechanism may be a diode mode, and the second operating mechanism may be a field-effect transistor mode. The first operating mechanism may be mainly performed via the ohmic contact CT1 of the ambipolar contact DC, whereas the second operating mechanism may be mainly performed via the Schottky junction contact CT2 of the ambipolar contact DC.

Referring to FIGS. 4 and 7B, the memory strings STL2 may include horizontal channels stacked on the main surface of the substrate 10. The 3D non-volatile memory device 50b, shown in FIG. 7B, includes three memory layers L1, L2, and L3. As shown in FIG. 4, first ends of the memory strings STL2 include first conductive-type regions NA that are electrically connected to a common source line CSL, which is also referred to as a first wire. Second ends of the memory strings STL2 include second conductive-type regions PA and are connected to bitlines BL, which are referred to as second wires.

Each memory string STL2 may include two string select transistors SST1 and SST2, which are each transistors for a bit selectivity. However, FIG. 7B is merely depicts an example, and in another embodiment, each memory string STL2 may instead include one string select transistor or three or more string select transistors.

A memory layer may be selected by a multi-level operation (LSM) scheme, in which the memory layer is selected when all of the string select transistors connected to the memory layer are turned on. The memory layer may be not selected when any one of the string select transistors connected to the memory layer is turned off.

As shown in FIGS. 7A and 7B, a mode select transistor MST may be provided between a bitline BL and each of the memory strings STL1 or STL2. Each of the mode select transistors MST may selectively drive one of the memory strings STL1 or STL2 of the 3D non-volatile memory device 50a or 50b in the diode mode or the field-effect transistor mode, by controlling an ambipolar contact, such as the ambipolar contact DC of FIG. 4 or FIG. 3B, between each mode select transistor MST and the corresponding bitline BL. That is, using the ambipolar contact DC, each of the mode select transistors MST may drive the corresponding one of the memory strings STL1 or STL2 according to one of the first operating mechanism based on the diode mode and the second operating mechanism based on the field-effect transistor mode, while maintaining an identical architecture. The two operating mechanisms may be attributed to the ambipolar contact DC, which may provide a charge path for both electron carriers and hole carriers.

In the present specification, the first operating mechanism is referred to as a "positive feedback diode-type operating mechanism." An example of the positive feedback diode-type operating mechanism is disclosed in Korean Patent Registration No. 1,538,071, the entire disclosure of which is herein incorporated by reference. The first operating mechanism may be mainly performed via the ohmic contact CT1 of the ambipolar contact DC, whereas the second operating mechanism may be mainly performed via the Schottky junction contact CT2 of the ambipolar contact DC.

Figure 8A:
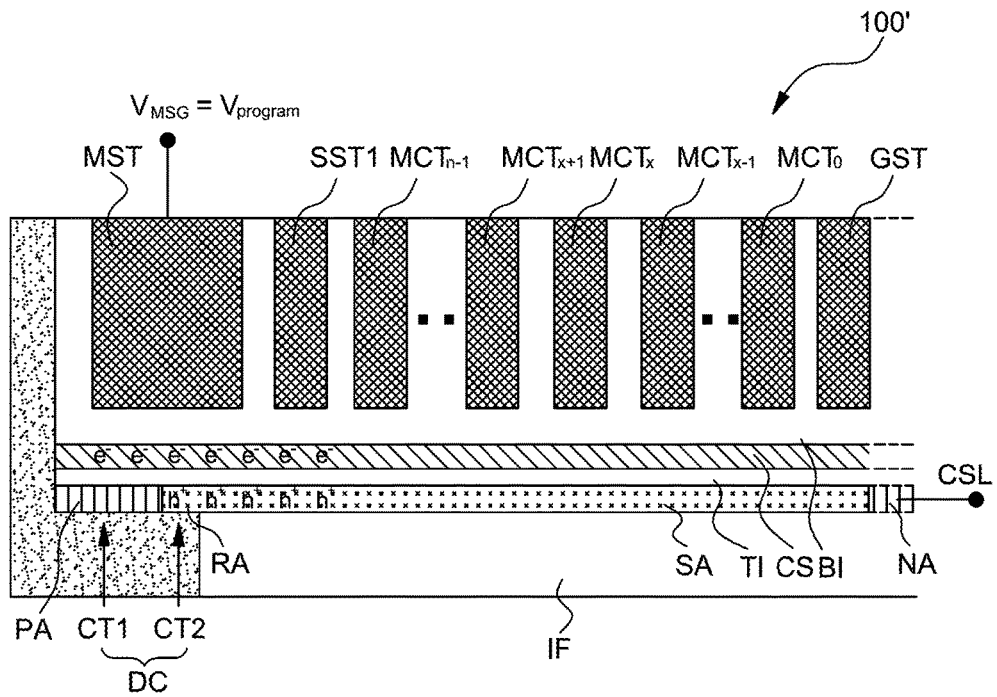
FIGS. 8A and 8B are cross-sectional diagrams illustrating a method of driving a non-volatile memory device including an ambipolar contact according to an embodiment of the present disclosure.
Figure 8B:
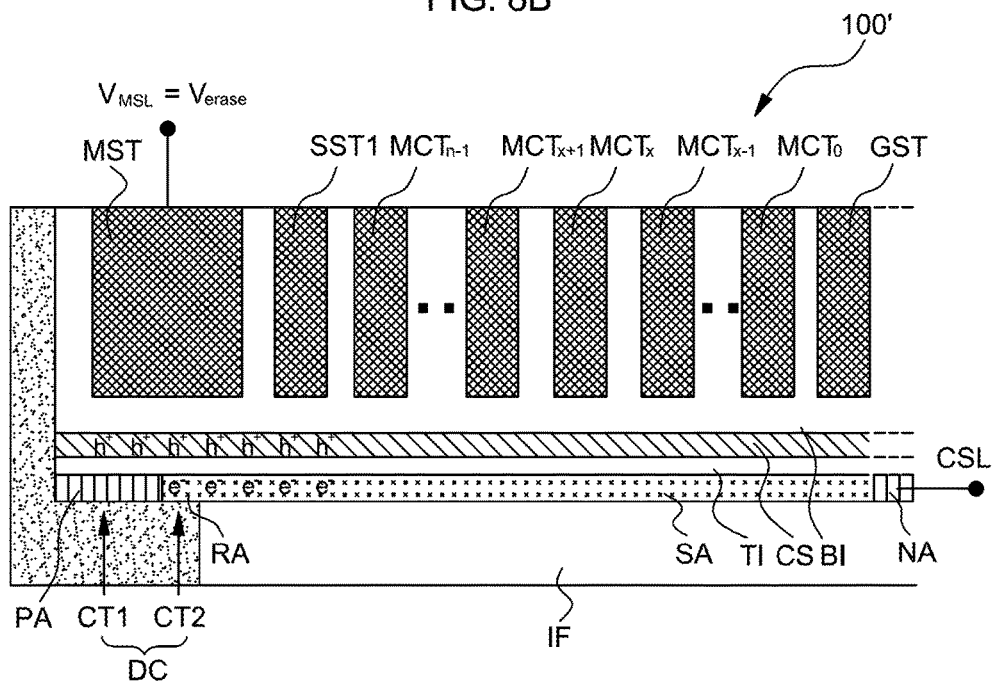
Figure 9A:
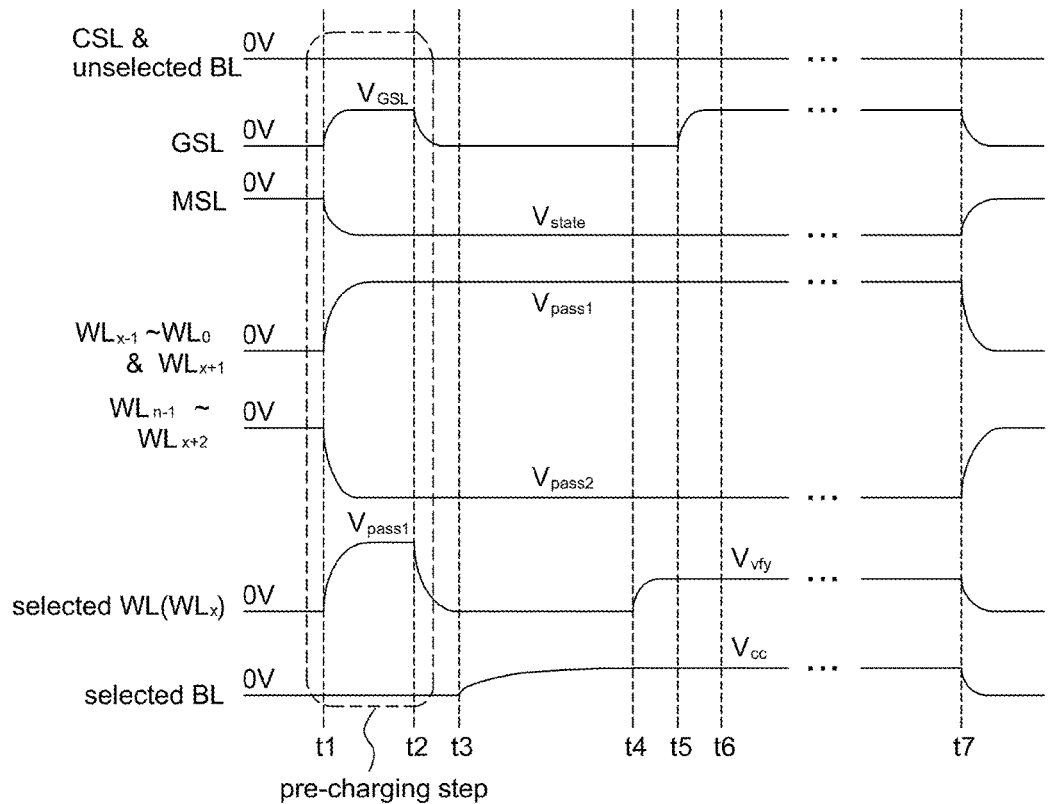
FIGS. 9A and 9B are timing diagrams of voltage signals applied to gate electrodes according to an embodiment of the present disclosure.
Figure 9B:
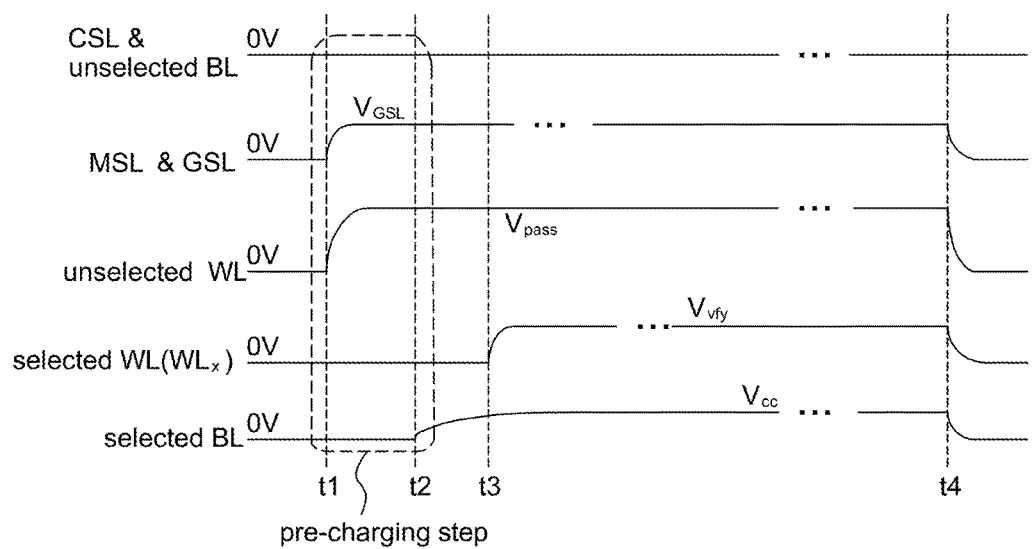

FIGS. 8A and 8B are cross-sectional diagrams illustrating a method of driving a non-volatile memory device including an ambipolar contact based on a first operating mechanism and a second operating mechanism according to an embodiment. FIGS. 9A and 9B are timing diagrams of voltage signals applied to gate electrodes using the first operating mechanism and the second operating mechanism, respectively, according to an embodiment.

Referring to FIGS. 8A and 8B, a non-volatile memory device 100' may include a mode select transistor MST, a string select transistor SST1, a ground select transistor GST (which may also be referred to as a string select transistor), and memory cell transistors $MCT_{n-1}$ to $MCT_0$. Gate electrodes of the mode select transistor MST, the string select transistor SST1, the ground select transistor GST, and the memory cell transistors $MCT_{n-1}$ to $MCT_0$ are electrically connected to and receive voltage signals from a mode select line MSL, a string select line SSL1, a ground select line GSL, and wordlines $WL_{n-1}$ to $WL_0$, respectively.

In the first operating mechanism, a method of reading a memory string may include a pre-charging step and a read process for reading data from a selected memory cell transistor $MCT_x$, as shown in FIG. 9A. The pre-charging step may include applying a weak bias to a selected memory string, in order to prevent an undesired memory cell from being programmed, or to prevent lifespan degradation of the selected memory string due to a strong electric field induced at a semiconductor region SA of the selected memory string.

For example, when the pre-charging step is not performed, a channel potential of an unselected pass memory cell transistor $MCT_{x+1}$ at a side of a p-type second conductive-type region PA selected from two unselected memory cell transistors $MCT_{x+1}$ and $MCT_{x-1}$ adjacent to the selected memory cell transistor $MCT_x$ may be boosted by a pass voltage $V_{pass}$, and thus a strong electric field may be generated. As a result, hot carriers may be generated, and thus the unselected pass memory cell transistor $MCT_{x+1}$ may be undesirably programmed or degraded. However, when the pre-charging step is performed according to an embodiment, electron charges and hole charges are supplied to the channel of a semiconductor region SA, and a channel potential of an unselected pass memory cell transistor cannot be boosted by a pass voltage $V_{pass}$. Accordingly, an induced electric field may be significantly reduced.

The pre-charging step described above is merely an example and may be omitted. However, the pre-charging step may improve the durability of the selected memory string.

The pre-charging step, according to an embodiment, is performed from a time point t1 to a time point t2, in which a common source line and unselected bitlines are grounded and a selected bitline is also grounded. A positive turn-on voltage $V_{GSL}$ is applied to the ground select line GSL, and a negative turn-on voltage $V_{STATE}$ is applied to the mode select line MSL. A positive pass voltage $V_{pass1}$ is applied to a wordline $WL_x$ of the selected memory cell transistor $MCT_x$. The positive pass voltage $V_{pass1}$ is also applied to lower memory cell transistors $MCT_{x-1}$ to $MCT_0$ of the memory cell transistor $MCT_x$ and an upper nearby memory cell transistor $MCT_{x+1}$ adjacent to the selected memory cell transistor $MCT_x$. Simultaneously, a negative pass voltage $V_{pass2}$ may be applied to upper memory cell transistors $MCT_{n-1}$ to $MCT_{x+2}$ (also referred to as upper-upper memory cell transistors) of the upper nearby memory cell transistor $MCT_{x+1}$. By performing the pre-charging step, electrons or holes may be supplied to the channel from the bitline BL and the common source line CSL.

The electrons may be smoothly supplied to the channel of the semiconductor region SA via a Schottky junction contact CT2 of the bitline BL by the positive turn-on voltage $V_{GSL}$ applied to the ground select line GSL and the negative pass voltage $V_{pass2}$ applied to the upper-upper memory cell transistors $MCT_{x+2}$ to $MCT_{n-1}$. Hole charges may be smoothly supplied to the channel of the semiconductor region SA from the common source line CSL by the negative turn-on voltage $V_{STATE}$, which is applied to the mode select line MSL, and the negative pass voltage $V_{pass2}$, which is applied to the wordlines $WL_{n-1}$ through $WL_{x+2}$ of the upper-upper memory cell transistors $MCT_{n-1}$ to $MCT_{x+2}$.

According to an embodiment, a read process may include a first step performed from a time point t2 to a time point t3, a second step performed from the time point t3 to a time point t4, a third step performed from the time point t4 to a time point t5, a fourth step performed from the time point t5 to a time point t6, and a fifth step performed from the time point t6 to a time point t7. In the first step, a node of the common source line CSL is charged by applying a voltage (e.g., 0 V), which is smaller than a turn-off voltage or a verify voltage $V_{VFY}$, to the ground select line GSL and the selected wordline $WL_x$. In the second step, an operation voltage Vcc is applied to the selected bitline (selected BL). In an embodiment, the first and second steps of the read process may be separately performed with respect to even-numbered bitlines and odd-numbered bitlines. According to another embodiment, when a read operation is performed with respect to all the bitlines, it is not necessary to distinguish a selected bitline from unselected bitlines.

In the third step, a read voltage $V_{VFY}$ is applied to the selected wordline WLx. Next, in the fourth step, while the read voltage $V_{VFY}$ is being continuously applied to the selected wordline WLx, a turn-on voltage $V_{GSL}$ is applied to the ground select line GSL. In the fifth step, a read operation of the selected memory cell transistor $MCT_x$ is initiated. The read operation of the selected memory cell transistor $MCT_x$ may be a verification operation.

Referring to FIG. 9B, a method of reading a memory string using the second operating mechanism may include a pre-charging step and a read process for reading data from a selected memory cell transistor $MCT_x$. The pre-charging step of the second operating mechanism is identical to that of the first operating mechanism, and may include applying a weak bias to the selected memory string in order to prevent an undesired memory cell from being programmed or to prevent lifespan degradation of the selected memory string due to a strong electric field induced at a semiconductor region SA of the selected memory string during the read process. In an embodiment, the pre-charging step may be omitted.

The pre-charging step of the second operating mechanism, according to an embodiment, is performed from the time point t1 to the time point t2. The common source line and unselected bitlines are grounded, and a selected bitline is also grounded. A positive turn-on voltage $V_{GSL}$ may be applied to the mode selection line MSL and the ground select line GSL. A positive pass voltage $V_{pass}$ may be applied to unselected wordlines WL of unselected memory cell transistors. As a result, electrons are supplied to the channel of the semiconductor region SA from the bitline BL via the Schottky junction contact CT2 and electrons are also supplied to the channel of the semiconductor region SA from the common source line CSL.

According to an embodiment, the read process of the second operating mechanism may include a first step that is performed from the time point t2 to the time point t3 and a second step that is performed from the time point t3 to the time point t4. As the pre-charging step is performed, a portion of the channel of the semiconductor region SA between the common source line CSL to the bitline BL is charged with electrons. In the first step of the read process, an operation voltage Vcc (also referred to as a common collector voltage) is applied to a selected bitline BL in order to prepare for a current that will flow through the selected bitline BL, whereas the unselected bitlines BL are maintained at 0 V in order to prevent a current from flowing therethrough. Next, in the second step, a read voltage $V_{VFY}$ is applied to the selected wordline WLx and a pass voltage $V_{pass}$ is applied to unselected wordlines (unselected WL), thereby initiating a read process verify step.

Referring back to FIGS. 8A and 8B, according to an embodiment, like the memory cell transistors MCT, a mode select transistor MST of the non-volatile memory device may share data storage layers with memory cell transistors MCT. To this end, data storage layers of memory cell transistors may be stacked between a gate electrode MSG and a neighbouring portion RA that vertically overlaps the gate electrode MSG. The data storage layers may include a tunnel insulation layer TI, a charge storage layer CS, and a blocking insulation layer BI. When the mode select transistors share the same data storage layer, the mode select transistors may be programmed as described below. As a result, by performing a pre-programming operation or a pre-erasing operation with respect to the ambipolar contact DC, operation characteristics of operations regarding a memory cell transistor, such as an erase operation or a read operation, may be enhanced.

According to an embodiment, as shown in FIG. 8A, in the first operating mechanism, when the second conductive-type region PA has is a p-type region, hole charges may be accumulated in the neighbouring portion RA by performing a pre-programming operation on the neighbouring portion RA. The accumulation of hole charges induces an electrical impurity doping effect in the neighbouring portion RA. To this end, a suitable programming operation may be performed with respect to the selected mode select transistor MST.

Furthermore, as shown in FIG. 8B, in the second operating mechanism, when the second conductive-type region PA is a p-type region, electron charges may be accumulated in the neighbouring portion RA by performing a pre-erasing operation. Similarly, the accumulated electrons in the neighbouring portion RA may induce an electrical impurity doping effect in the neighbouring portion RA.

The charges accumulated by performing the pre-programming operation and/or the pre-erasing operation may increase a turn-on voltage or reduce an operation voltage during a read operation using the first operating mechanism or the second operating mechanism. Accordingly, a sensing margin and a power efficiency of a semiconductor memory device including the ambipolar contact DC may be improved.

The pre-programming operation and the pre-erasing operation may be performed together with the pre-charging step, during an operation for reading a data storage device including the neighbouring portion RA. In this case, improved durability, improved sensing margin, and reduced power consumption of the data storage device may be expected.

Figure 10:
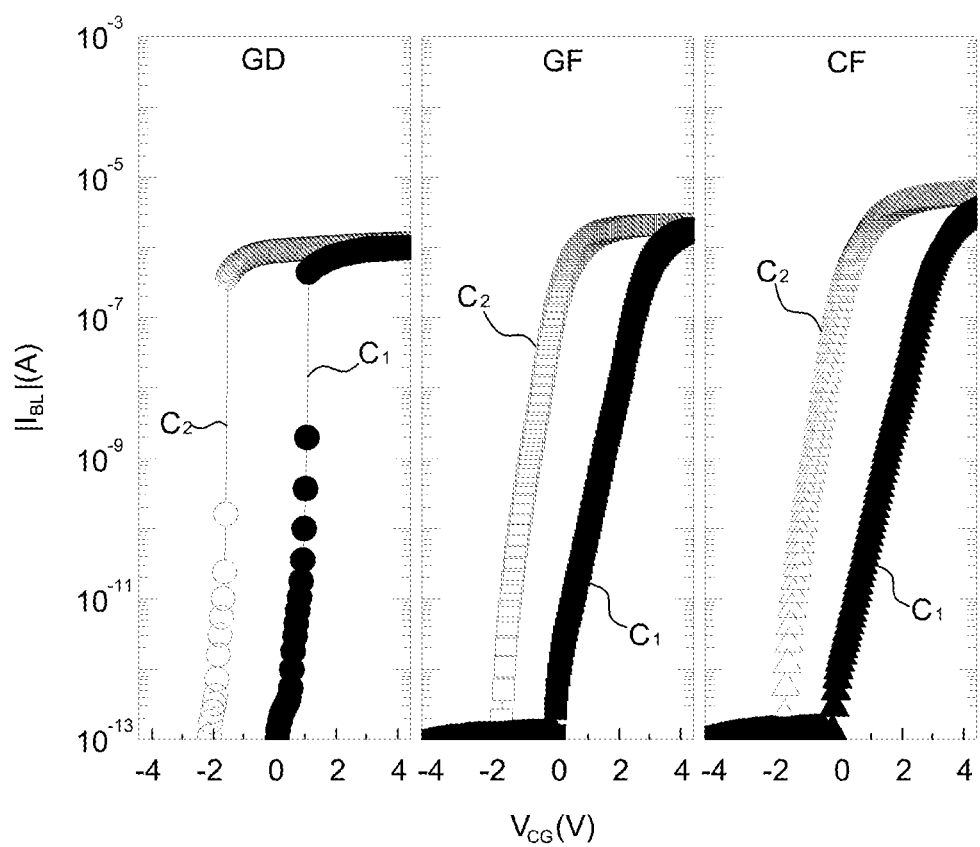
FIG. 10 is a diagram showing a result of a simulation according to an embodiment of the present disclosure.

FIG. 10 is a diagram showing a result of a simulation according to an embodiment, and shows program and erase characteristics (graph GD) of a non-volatile memory device including an ambipolar contact using the first operating mechanism, program and erase characteristics (graph GF) of a non-volatile memory device including an ambipolar contact using the second operating mechanism, and program and erase characteristics (graph CF) of a non-volatile memory device having a conventional architecture.

In the non-volatile memory devices referenced in FIG. 10, the first conductive-type region NA includes a phosphorus (P) impurity at a concentration of about $1 \times 10^{20}$ cm$^{-3}$. The second conductive-type region PA includes a boron (B) impurity at a concentration of about $1 \times 10^{18}$ cm$^{-3}$. The semiconductor region SA includes a $Si_{0.8}Ge_{0.2}$ semiconductor. The concentrations and the semiconductor material are merely examples of embodiments, and the present disclosure is not limited thereto.

Referring to graph GD of FIG. 10, the program characteristic C1 and the erase characteristic C2 of the non-volatile memory device having the ambipolar contact exhibits an almost vertical I-V program characteristic C1 and erase characteristic C2 while using the first operating mechanism, that is, using a diode operation. As shown in graph GF of FIG. 10, the program characteristic C1 and the erase characteristic C2 of the non-volatile memory device using the second operating mechanism also exhibits favourable I-V characteristics using the second operating mechanism, that is, a field effect transistor operation, as compared to the program and erase characteristics of the non-volatile memory device with a single contact, which are depicted by graph CF.

Therefore, according to an embodiment, program and erase operations using two operating mechanisms may be embodied in a single architecture by using a mode select transistor. Furthermore, the first operating mechanism embodies a positive feedback diode-type operation and shows almost vertical I-V characteristic. As a result, a refresh margin of a memory cell including embodiments of the present disclosure may be widened, and an operating speed of a non-volatile memory device including the memory cell may be improved.

Figure 11:
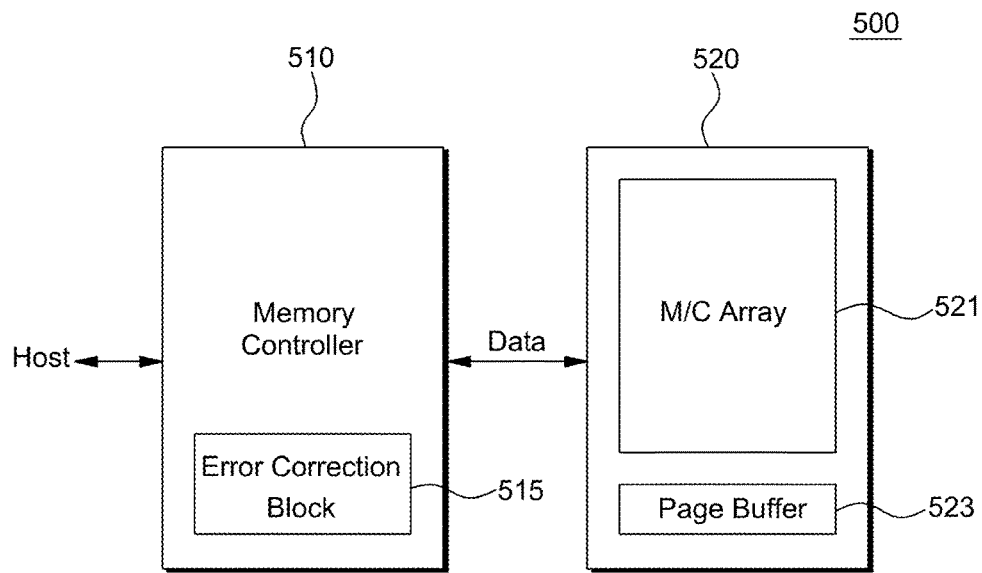
FIG. 11 is a block diagram showing a memory system in accordance with an embodiment of the present disclosure.

FIG. 11 is a block diagram showing a memory system 500 in accordance with an embodiment.

Referring to FIG. 11, the memory system 500 includes a memory controller 510 and a non-volatile memory device 520. The memory controller 510 may perform error correcting codes with respect to the non-volatile memory device 520. The memory controller 510 may control the non-volatile memory device 520 based on commands and addresses from an external circuit.

The memory controller 510 may perform an error correcting encoding process on a data requested to write, when the memory controller 510 receives a write request from a host. Furthermore, the memory controller 510 may control the non-volatile memory device 520 to program the encoded data at a memory region corresponding to a provided address. Furthermore, during a read operation, the memory controller 510 may perform an error correcting decoding process on a data output from the non-volatile memory device 520. Errors included in output data may be corrected by the error correcting decoding process. To detect and correct the errors, the memory controller 510 may include an error correction block 515.

The non-volatile memory device 520 may include a memory cell array 521 and a page buffer 523. The memory cell array 521 may include an array of single-level memory cells or 2 or higher bit multi-level memory cells. When the memory controller 510 receives an initialization request, the memory controller 510 may initialize string selection transistors of respective memory layers to have a predetermined state (threshold voltage) by using a programming technique or an erasing technique using time varying erase voltage signals.

Figure 12:
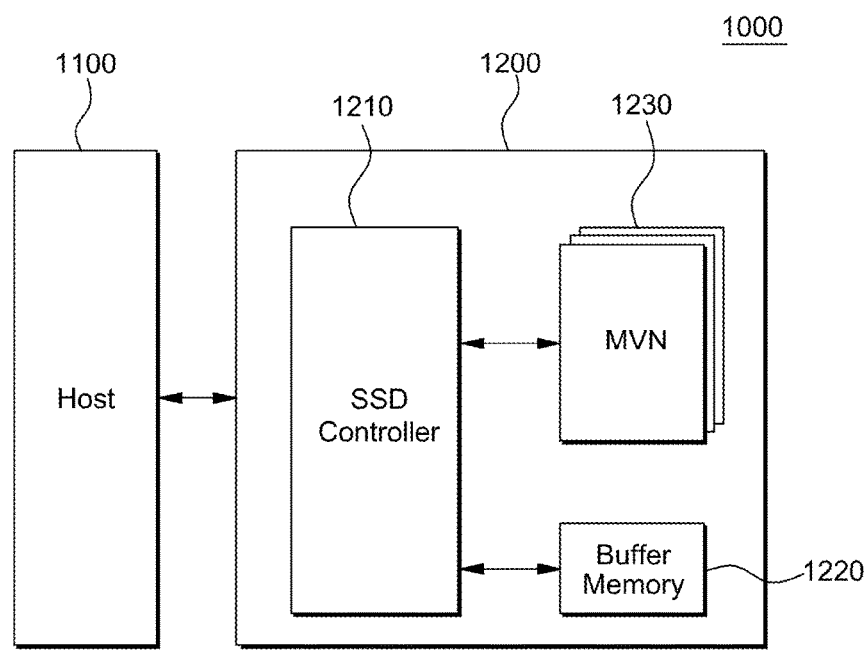
FIG. 12 is a block diagram showing a storage device including a SSD in accordance with an embodiment of present disclosure.

FIG. 12 is a block diagram showing a storage device 1000 including a SSD in accordance with an embodiment of present disclosure.

Referring to FIG. 12, the storage device 1000 includes a host 1100 and a SSD 1200. The SSD 1200 may include a SSD controller 1210, a buffer memory 1220, and a non-volatile memory device 1230. The SSD controller 1210 provides electric and physical connections between the host 1100 and the SSD 1200. In an embodiment, the SSD controller 1210 provides an interface between the host 1100 and the SSD 1200 in correspondence to a bus format of the host 1100. Furthermore, the SSD controller 1210 may decode commands provided by the host 1100 and access the non-volatile memory device 1230 based on a result of the decoding. Unlimited examples of the bus format of the host 1100 may include USB (Universal Serial Bus), SCSI (Small Computer System Interface), PCI express, ATA (Advanced Technology Attachment), PATA (Parallel ATA), SATA (Serial ATA), and SAS (Serial Attached SCSI).

A data to be written provided by the host 1100 or a data read out from the non-volatile memory device 1230 may be temporarily stored in the buffer memory 1220. When the host 1100 sends a read request and data existing in the non-volatile memory device 1230 is cached, the buffer memory 1220 may provide a cache function for providing cached data directly to the host 1100. Generally, data transmission rate based on a bus format (e.g., SATA or SAS) of the host 1100 may be faster than data transmission speed of memory channels of the SSD 1200. In this case, the large-capacity buffer memory 1220 may be provided to minimize performance deterioration due to the speed difference. The buffer memory 1220 therefor may be a synchronous DRAM for providing sufficient buffering performance. However, the present invention is not limited thereto.

The non-volatile memory device 1230 may be provided as a storage medium of the SSD 1200. For example, the non-volatile memory device 1230 may be a NAND-type flash memory with large storage capacity. For another example, a NOR-type flash memory, a phase-change memory, a magnetic memory, a resistive memory, a ferrodielectric memory, or a memory system including a combination thereof may be applied as the non-volatile memory device 1230.

Figure 13:
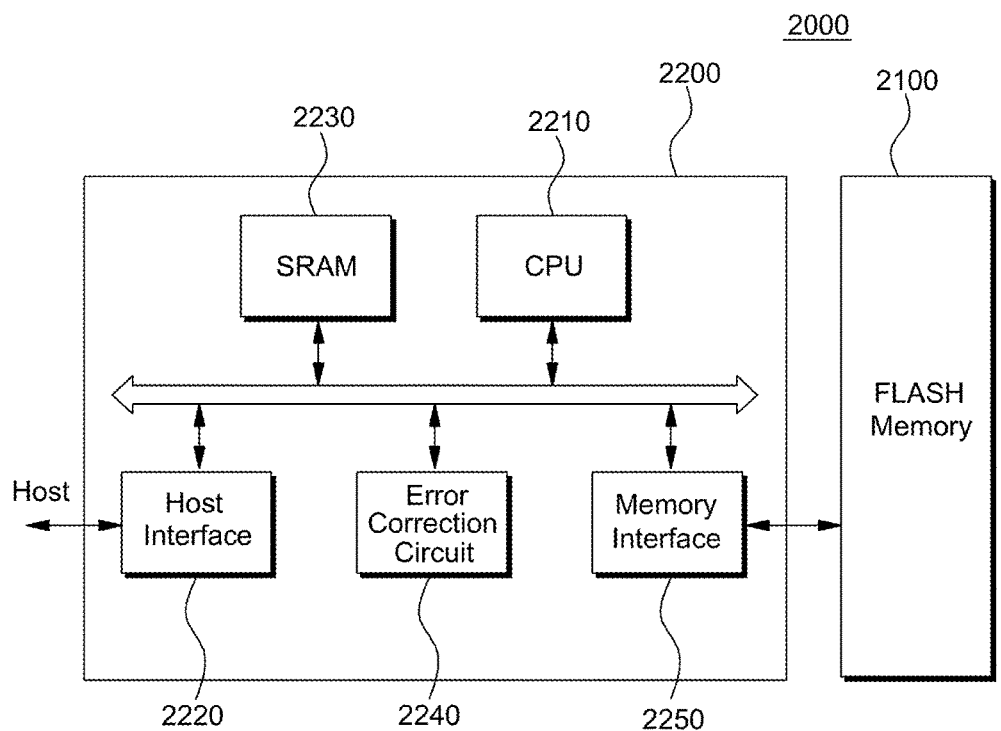
FIG. 13 is a block diagram showing a memory system in accordance with another embodiment of the present disclosure.

FIG. 13 is a block diagram showing a memory system 2000 in accordance with another embodiment of the present disclosure.

Referring to FIG. 13, the memory system 2000 may include a memory controller 2200 and a flash memory device 2100. The flash memory device 2100 may include the non-volatile memory devices 100, 200, and 300 as described above with reference to FIGS. 1 through 7. The flash memory device 2100 may detect memory cells with abnormal speeds during verification of target states, and thus the flash memory device 2100 may show reliable program performance.

The memory controller 2200 may be configured to control the flash memory device 2100. An SRAM 2230 may be used as an operation memory for the CPU 2210. A host interface 2220 may embody a data exchange protocol for the host to be connected to the memory system 2000. An error correction circuit 2240 equipped in the memory controller 2200 may detect and correct errors included in data read out from the flash memory device 2100. A memory interface 2250 may perform interfacing with the flash memory device 2100. A CPU 2210 may perform overall control operations for data exchange of the memory controller 2200. The memory system 2000 in accordance with the present invention may further include a ROM (not shown) that stores code data for interfacing with a host.

The flash memory device 2100 may be configured to communicate with an external circuit (e.g., a host) via one of various interface protocols, such as USB, MMC, PCI-E, SAS, SATA, PATA, SCSI, ESDI, or IDE. The memory system 2000 in accordance with the present invention may be applied to various user devices, such as a ultra-mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device capable of transmitting and receiving data wirelessly, or a home network.

Figure 14:
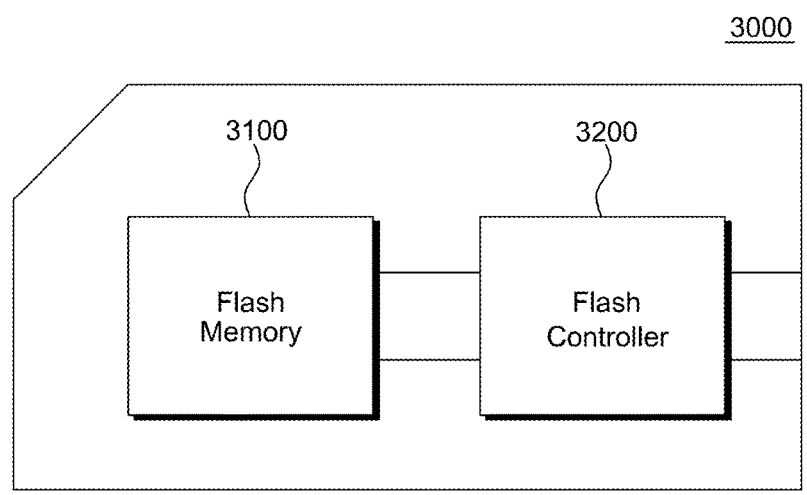
FIG. 14 is a block diagram showing a data storage device in accordance with another embodiment of the present disclosure.

FIG. 14 is a block diagram showing a data storage device 3000 in accordance with another embodiment of the present disclosure.

Referring to FIG. 14, the data storage device 3000 may include a flash memory 3100 and a flash controller 3200. The flash controller 3200 may control the flash memory 3100 based on control signals received from an external circuit connected to the data storage device 3000. A 3D memory array structure of the flash memory 3100 may be a channel stacked structure, a straight-shaped bit cost scalable structure, or a pipe-shaped BiCs structure. However, the above-stated structures are merely examples, and the present invention is not limited thereto.

The data storage device 3000 in accordance with the present invention may constitute a memory card device, a SSD device, a multimedia card device, a SD card, a memory stick device, a hard disk drive device, a hybrid drive device, or a USB flash device. For example, the data storage device 3000 in accordance with the present invention may be a memory card that satisfies a standard or a specification to be generally used in an electronic device, such as a digital camera or a personal computer.

Figure 15:
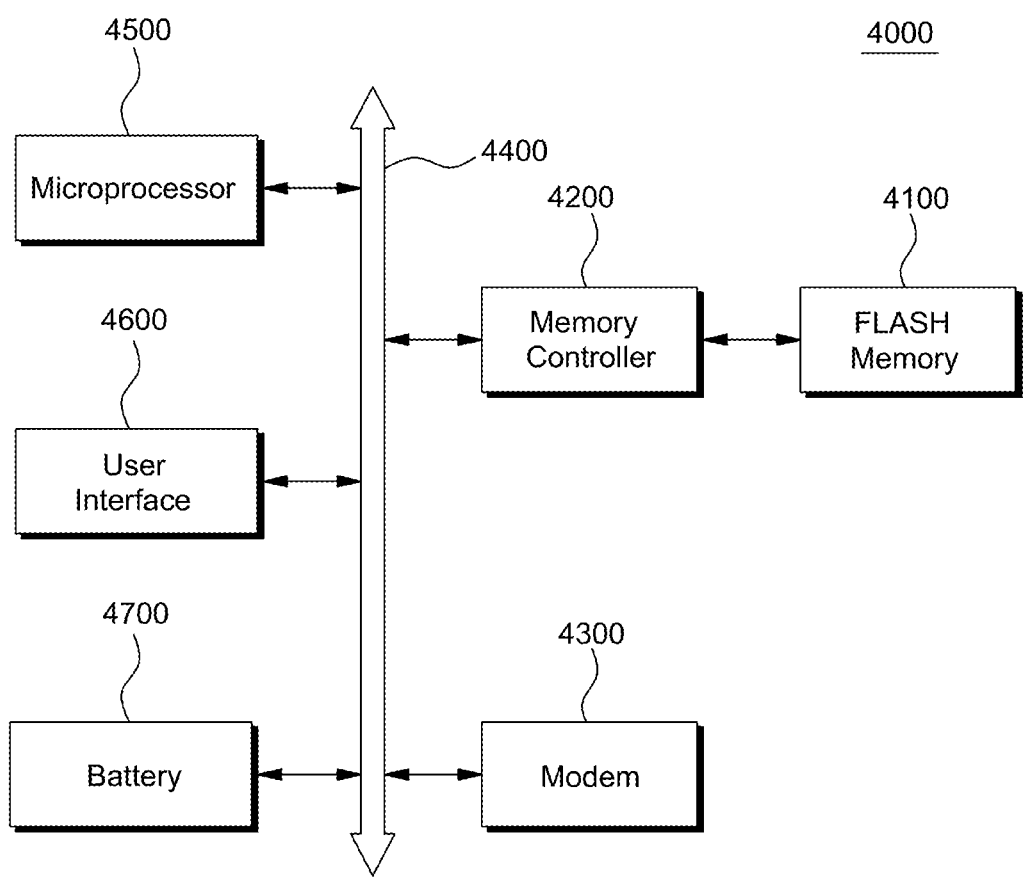
FIG. 15 is a block diagram showing a flash memory device and a computing system including the flash memory device in accordance with an embodiment of the present disclosure.

FIG. 15 is a block diagram showing a flash memory device 4100 and a computing system 4000 including the flash memory device 4100 in accordance with an embodiment of the present disclosure.

Referring to FIG. 15, the computing system 4000 in accordance with the present disclosure may include the flash memory device 4100, a memory controller 4200, a modem 4300, such as a baseband chipset, a microprocessor 4500, and a user interface 4600 that are electrically connected to a bus 4400.

The flash memory device 4100 shown in FIG. 10 may be a non-volatile memory device as described above. The computing system 4000 in accordance with the present invention may be a mobile device. In this case, the computing system 4000 may further include a battery 4700 for supplying a power for operating the computing system 4000. Although not shown, the computing system 4000 in accordance with the present invention may further include an application chipset, a camera image processor (CIS), or a mobile DRAM. The memory controller 4200 and the flash memory device 4100 may constitute a SSD using a non-volatile memory device for storing data.

A non-volatile memory device and/or a memory controller in accordance with the present invention may be mounted via various-types of packages. For example, a non-volatile memory device and/or a memory controller may be mounted via any of various packages including PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

While embodiments of the present disclosure has been particularly shown and described, it will be understood by those of ordinary skill in the art that various changes in form and details may be made therein without departing from the spirit and scope of the present disclosure as defined by the following claims.

What is claimed is:

1. A data storage device, comprising:
    a semiconductor structure including a first conductive-type region having a first-type conductivity, a second conductive-type region that is spaced apart from the first conductive-type region and has a second-type conductivity opposite to the first-type conductivity of the first conductive-type region, and a semiconductor region that is disposed between the first conductive-type region and the second conductive-type region, the semiconductor region including a neighbouring portion that is adjacent to the second conductive-type region;
    a mode select transistor including a gate electrode and an insulation layer, the gate electrode being aligned with the neighbouring portion of the semiconductor region, the insulation layer being disposed between the gate electrode and the neighbouring portion of the semiconductor region;
    a plurality of memory cell transistors including a plurality of control gate electrodes and a data storage layer, the plurality of control gate electrodes being aligned with the semiconductor region, the data storage layer being interposed between the plurality of control gate electrodes and the semiconductor region;
    a first wire electrically connected to the first conductive-type region; and
    a second wire connected to an ambipolar contact, the ambipolar contact including a first contact and a second contact, the first contact being between the second wire and the second conductive-type region, the second contact between the second wire and the neighbouring portion,
    wherein the semiconductor structure has a hollow cylindrical structure, and both of a surface of the second conductive-type region and a surface of the neighboring portion are exposed inside of the hollow cylindrical structure, and
    wherein the first contact is provided between the second wire and the exposed surface of the second conductive-type region, and the second contact is provided between the second wire and the exposed surface of the neighbouring portion.

2. The data storage device of claim 1, wherein the first contact is an ohmic contact and the second contact is a Schottky contact.

3. The data storage device of claim 1, wherein each of the first and second conductive-type regions comprises a doped impurity region, and
    wherein the semiconductor region is an intrinsic semiconductor region or a lightly doped impurity region having the first-type conductivity.

4. The data storage device of claim 1, wherein the second conductive-type region and the semiconductor region are integrated into a semiconductor layer or a semiconductor body.

5. The data storage device of claim 1, wherein the semiconductor region of the semiconductor structure has a 3D structure that vertically extends from a main surface of a substrate, the semiconductor region including a vertical channel.

6. The data storage device of claim 1, wherein the first conductive-type region of the semiconductor structure comprises a first conductive-type impurity region disposed in or on the substrate, and
    wherein the semiconductor region contacts the first conductive-type impurity region.

7. The data storage device of claim 1,
    wherein an interior space of the semiconductor structure is filled with an insulator,
    wherein a surface of the insulator is partially recessed from an end of the semiconductor structure toward the substrate, the surface of the second conductive-type region and the surface of the neighbouring portion being exposed between the end of the semiconductor structure and the recessed surface of the insulator.

8. The data storage device of claim 1, wherein, when a negative voltage is applied to the gate electrode of the mode select transistor, the data storage device is driven by a hole current flowing in the semiconductor region, and
    wherein, when a positive voltage is applied to the gate electrode of the mode select transistor, the data storage device is driven by an electron current flowing in the semiconductor region.

9. The data storage device of claim 8, wherein, when the semiconductor structure is driven by the hole current, the data storage device is operated based on a positive feedback diode-type operating mechanism, and when the semiconductor structure is driven by the electron current, the data storage device is operated based on a field-effect transistor-type operating mechanism.

10. A method of driving the data storage device of claim 1, the method comprising a read process based on any of a positive feedback diode-type operating mechanism and a field-effect transistor-type operating mechanism, according to a polarity of a voltage applied to the gate electrode of the mode select transistor.

11. The method of claim 10, wherein the first-type conductivity is an n-type conductivity and the second-type conductivity is a p-type conductivity,
    wherein the data storage device is operated based on the positive feedback diode-type operating mechanism when a negative operation voltage is applied to the gate electrode of the mode select transistor, and
    wherein the data storage device is operated based on the field-effect transistor-type operating mechanism when a positive operation voltage is applied to the gate electrode of the mode select transistor.

12. A data storage device, comprising:
a semiconductor structure including a first conductive-type region having a first-type conductivity, a second conductive-type region that is spaced apart from the first conductive-type region and has a second-type conductivity opposite to the first-type conductivity of the first conductive-type region, and a semiconductor region that is disposed between the first conductive-type region and the second conductive-type region, the semiconductor region including a neighbouring portion that is adjacent to the second conductive-type region;
a mode select transistor including a gate electrode and an insulation layer, the gate electrode being aligned with the neighbouring portion of the semiconductor region, the insulation layer being disposed between the gate electrode and the neighbouring portion of the semiconductor region;
a plurality of memory cell transistors including a plurality of control gate electrodes and a data storage layer, the plurality of control gate electrodes being aligned with the semiconductor region, the data storage layer being interposed between the plurality of control gate electrodes and the semiconductor region;
a first wire electrically connected to the first conductive-type region; and
a second wire connected to an ambipolar contact, the ambipolar contact including a first contact and a second contact, the first contact being between the second wire and the second conductive-type region, the second contact between the second wire and the neighbouring portion,
wherein the data storage device undergoes a pre-programming operation and a pre-erasing operation, the pre-programming operation and the pre-erasing operation being performed based on a mode selected by the mode select transistor, the selected mode setting a type of driving charges of the semiconductor structure.

13. A data storage device, comprising:
a semiconductor structure including a first conductive-type region having a first-type conductivity, a second conductive-type region that is spaced apart from the first conductive-type region and has a second-type conductivity opposite to the first-type conductivity of the first conductive-type region, and a semiconductor region that is disposed between the first conductive-type region and the second conductive-type region, the semiconductor region including a neighbouring portion that is adjacent to the second conductive-type region;
a mode select transistor including a gate electrode and an insulation layer, the gate electrode being aligned with the neighbouring portion of the semiconductor region, the insulation layer being disposed between the gate electrode and the neighbouring portion of the semiconductor region;
a plurality of memory cell transistors including a plurality of control gate electrodes and a data storage layer, the plurality of control gate electrodes being aligned with the semiconductor region, the data storage layer being interposed between the plurality of control gate electrodes and the semiconductor region;
a first wire electrically connected to the first conductive-type region; and
a second wire connected to an ambipolar contact, the ambipolar contact including a first contact and a second contact, the first contact being between the second wire and the second conductive-type region, the second contact between the second wire and the neighbouring portion,
wherein each of the second conductive-type region and the semiconductor region has a solid pillar structure, and
wherein the second wire contacts exposed surfaces of the second conductive-type region and the neighbouring portion, the ambipolar contact including the contact between the second wire and the exposed surfaces.

14. A data storage device, comprising:
a semiconductor structure including a first conductive-type region having a first-type conductivity, a second conductive-type region that is spaced apart from the first conductive-type region and has a second-type conductivity opposite to the first-type conductivity of the first conductive-type region, and a semiconductor region that is disposed between the first conductive-type region and the second conductive-type region, the semiconductor region including a neighbouring portion that is adjacent to the second conductive-type region;
a mode select transistor including a gate electrode and an insulation layer, the gate electrode being aligned with the neighbouring portion of the semiconductor region, the insulation layer being disposed between the gate electrode and the neighbouring portion of the semiconductor region;
a plurality of memory cell transistors including a plurality of control gate electrodes and a data storage layer, the plurality of control gate electrodes being aligned with the semiconductor region, the data storage layer being interposed between the plurality of control gate electrodes and the semiconductor region;
a first wire electrically connected to the first conductive-type region; and
a second wire connected to an ambipolar contact, the ambipolar contact including a first contact and a second contact, the first contact being between the second wire and the second conductive-type region, the second contact between the second wire and the neighbouring portion,
wherein each of the second conductive-type region and the semiconductor region has a solid pillar structure, and
wherein the second wire fills a penetrating hole of the solid pillar structure, the penetrating hole having a depth from an end of the second conductive-type region to the neighbouring portion, the ambipolar contact being formed at a surface of the penetrating hole.

15. A data storage device, comprising:
a semiconductor structure including a first conductive-type region having a first-type conductivity, a second conductive-type region that is spaced apart from the first conductive-type region and has a second-type conductivity opposite to the first-type conductivity of the first conductive-type region, and a semiconductor region that is disposed between the first conductive-type region and the second conductive-type region, the semiconductor region including a neighbouring portion that is adjacent to the second conductive-type region;
a mode select transistor including a gate electrode and an insulation layer, the gate electrode being aligned with the neighbouring portion of the semiconductor region, the insulation layer being disposed between the gate electrode and the neighbouring portion of the semiconductor region;

a plurality of memory cell transistors including a plurality of control gate electrodes and a data storage layer, the plurality of control gate electrodes being aligned with the semiconductor region, the data storage layer being interposed between the plurality of control gate electrodes and the semiconductor region;

a first wire electrically connected to the first conductive-type region; and a second wire connected to an ambipolar contact, the ambipolar contact including a first contact and a second contact, the first contact being between the second wire and the second conductive-type region, the second contact between the second wire and the neighbouring portion, wherein charges are accumulated in the neighbouring portion when a pre-programming operation or a pre-erasing operation is performed, the mode select transistor selecting a mode of the data storage device corresponding to a type of the charges of the data storage device.

16. A method of driving a data storage device, the data storage device comprising:
a semiconductor structure including a first conductive-type region having a first-type conductivity, a second conductive-type region that is spaced apart from the first conductive-type region and has a second-type conductivity opposite to the first-type conductivity of the first conductive-type region, and a semiconductor region that is disposed between the first conductive-type region and the second conductive-type region, the semiconductor region including a neighbouring portion that is adjacent to the second conductive-type region;
a mode select transistor including a gate electrode and an insulation layer, the gate electrode being aligned with the neighbouring portion of the semiconductor region, the insulation layer being disposed between the gate electrode and the neighbouring portion of the semiconductor region;
a plurality of memory cell transistors including a plurality of control gate electrodes and a data storage layer, the plurality of control gate electrodes being aligned with the semiconductor region, the data storage layer being interposed between the plurality of control gate electrodes and the semiconductor region;
a first wire electrically connected to the first conductive-type region; and
a second wire connected to an ambipolar contact, the ambipolar contact including a first contact and a second contact, the first contact being between the second wire and the second conductive-type region, the second contact between the second wire and the neighbouring portion,
wherein the method further comprises:
performing a pre-programming operation or a pre-erasing operation based on a mode selected by the mode select transistor according to an operating mechanism of a read process.

17. A method of driving a data storage device, the data storage device comprising:
a semiconductor structure including a first conductive-type region having a first-type conductivity, a second conductive-type region that is spaced apart from the first conductive-type region and has a second-type conductivity opposite to the first-type conductivity of the first conductive-type region, and a semiconductor region that is disposed between the first conductive-type region and the second conductive-type region, the semiconductor region including a neighbouring portion that is adjacent to the second conductive-type region;
a mode select transistor including a gate electrode and an insulation layer, the gate electrode being aligned with the neighbouring portion of the semiconductor region, the insulation layer being disposed between the gate electrode and the neighbouring portion of the semiconductor region;
a plurality of memory cell transistors including a plurality of control gate electrodes and a data storage layer, the plurality of control gate electrodes being aligned with the semiconductor region, the data storage layer being interposed between the plurality of control gate electrodes and the semiconductor region;
a first wire electrically connected to the first conductive-type region; and
a second wire connected to an ambipolar contact, the ambipolar contact including a first contact and a second contact, the first contact being between the second wire and the second conductive-type region, the second contact between the second wire and the neighbouring portion,
wherein the method comprises:
performing a pre-charging step before a reading step on a selected one of the plurality of memory cell transistors, the pre-charging step preventing unnecessary programming of the semiconductor region.

18. The method of claim 17, wherein the pre-charging step comprises:
applying a negative turn-on voltage to a mode select line connected to the mode select transistor;
applying a positive pass voltage to lower memory cell transistors and to upper nearby memory cell transistors of the selected memory cell transistor; and
applying a negative pass voltage to upper-upper memory cell transistors of the selected memory cell transistor.

19. The method of claim 17, wherein the pre-charging step comprises:
applying a positive turn-on voltage to the mode select line of the mode select transistor and to the ground select line; and
applying a positive pass voltage to wordlines of unselected memory cell transistors.

20. The method of claim 17, further comprising:
performing a pre-programming operation or a pre-erasing operation on the mode select transistor according to the operating mechanism of the read process.

* * * * *